(12) United States Patent
Wigglesworth et al.

(10) Patent No.: US 8,524,121 B2
(45) Date of Patent: Sep. 3, 2013

(54) BI-INDOLINE-DITHIONE POLYMERS

(75) Inventors: Anthony James Wigglesworth, Oakville (CA); Yiliang Wu, Oakville (CA); Ping Liu, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 72 days.

(21) Appl. No.: 13/359,665

(22) Filed: Jan. 27, 2012

(65) Prior Publication Data

US 2013/0193380 A1    Aug. 1, 2013

(51) Int. Cl.
*H01B 1/00*    (2006.01)
(52) U.S. Cl.
USPC ......................................................... 252/500
(58) Field of Classification Search
USPC ......................................................... 252/500
See application file for complete search history.

(56) References Cited

PUBLICATIONS

Bailey, A. S., et al., "Reactions of Some Sulphur-containing Indoles with Arenesulphonyl Azides," J. Chem. Soc. Perkins I, 1974, 20, 2384-87.*

Ting Lei et al., "High-Performance Air-Stable Organic Field-Effect Transistors: Isoindigo-Based Conjugated Polymers," Journal of The American Chemical Society, 2011, 133, pp. 6099-6101.
Ergang Wang et al., "An Easily Accessible Isoindigo-Based Polymer for High-Performance Polymer Solar Cells," Journal of The American Chemical Society, 2011, 133, pp. 14244-14247.

* cited by examiner

*Primary Examiner* — Mark Kopec
*Assistant Examiner* — William Young
(74) *Attorney, Agent, or Firm* — Fay Sharpe LLP

(57) ABSTRACT

A polymer of Formula (I)

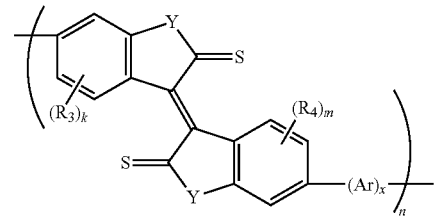

Formula (I)

wherein Ar, $R_1$, $R_2$, $R_3$, $R_4$, Y, x, k, m, and n are as described herein. The polymer may be used in a semiconducting layer of an electronic device.

20 Claims, 2 Drawing Sheets

BI-INDOLINE-DITHIONE POLYMERS

BACKGROUND

The present disclosure relates to thin-film transistors (TFTs) and/or other electronic devices comprising a semiconducting layer. The semiconducting layer is formed from a semiconductor composition as described herein. When the composition is used in the semiconducting layer of a device, high mobility and excellent stability may be achieved.

TFTs are generally composed of, on a substrate, an electrically conductive gate electrode, source and drain electrodes, an electrically insulating gate dielectric layer which separate the gate electrode from the source and drain electrodes, and a semiconducting layer which is in contact with the gate dielectric layer and bridges the source and drain electrodes. Their performance can be determined by the field effect mobility and the current on/off ratio of the overall transistor. High mobility and high on/off ratio are desired.

Organic thin-film transistors (OTFTs) can be used in applications such as radio frequency identification (RFID) tags and backplane switching circuits for displays, such as signage, readers, and liquid crystal displays, where high switching speeds and/or high density are not essential. They also have attractive mechanical properties such as being physically compact, lightweight, and flexible.

Organic thin-film transistors can be fabricated using low-cost solution-based patterning and deposition techniques, such as spin coating, solution casting, dip coating, stencil/screen printing, flexography, gravure, offset printing, ink jet-printing, micro-contact printing, and the like. To enable the use of these solution-based processes in fabricating thin-film transistor circuits, solution processable materials are therefore required. However, organic or polymeric semiconductors formed by solution processing tend to suffer from limited solubility, air sensitivity, and especially low field-effect mobility. This poor performance may be attributable to the poor film-forming nature of small molecules.

It would be desirable to develop semiconducting polymers that exhibit high field effect mobility, air stability, and good solubility.

BRIEF DESCRIPTION

The present disclosure relates, in various embodiments, to semiconducting polymers containing a dithioisoindigo moiety. The disclosure also relates to processes for making such polymers, compositions containing such polymers, and devices with layers containing such polymers.

Disclosed in various embodiments is a polymer of Formula (I):

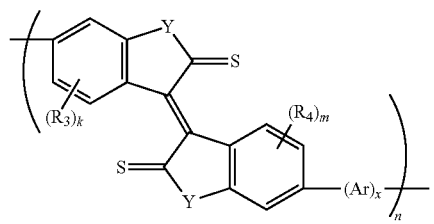

Formula (I)

wherein each Y is independently O or N—$R_5$ wherein each $R_5$ is independently hydrogen, alkyl, substituted alkyl, aryl, or substituted aryl; each $R_3$ and $R_4$ is independently alkyl, substituted alkyl, aryl, substituted aryl, heteroaryl, substituted heteroaryl, halogen, alkoxy, alkylthio, trialkylsilyl, —CN, or —$NO_2$; k and m are independently 0, 1, 2, or 3; each Ar is independently ethenyl, ethynyl, aryl, substituted aryl, heteroaryl, or substituted heteroaryl; x is from 0 to 8; and wherein n is the number of repeating units and is from 2 to about 5,000.

In particular embodiments, at least one Ar unit is thieno[3,2-b]thiophene:

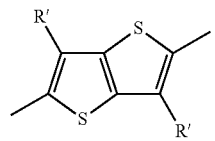

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —$NO_2$.

Each Ar unit (when present) may be independently selected from the group consisting of:

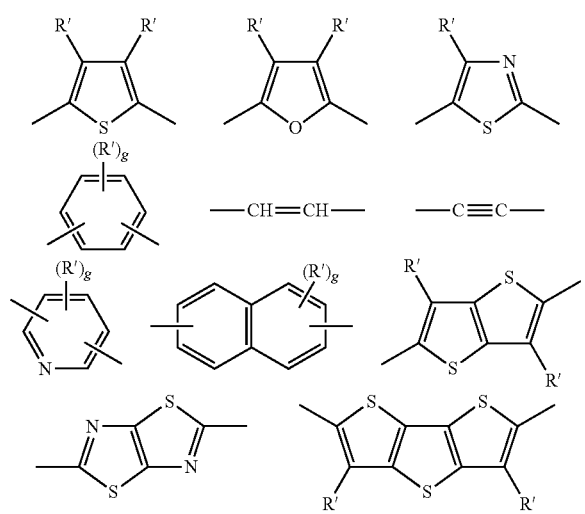

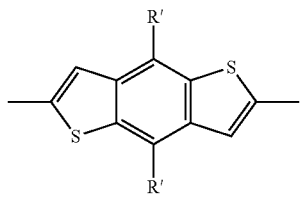

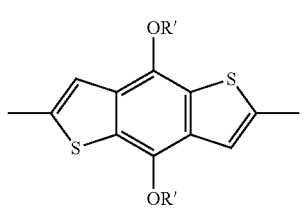

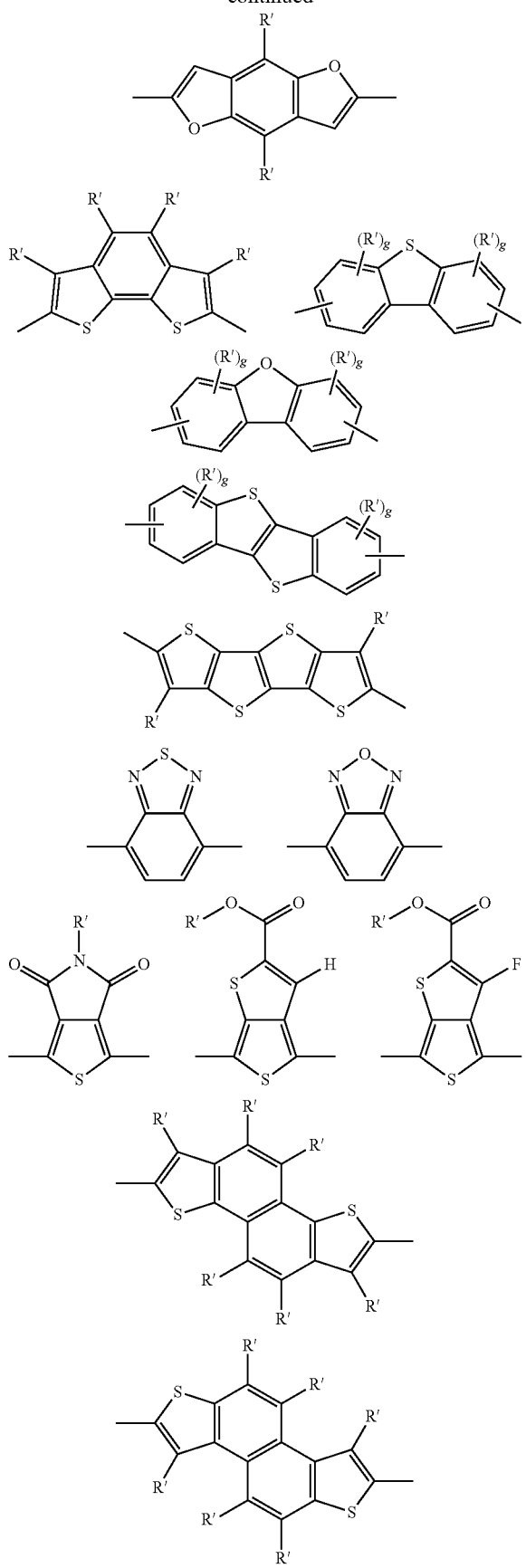
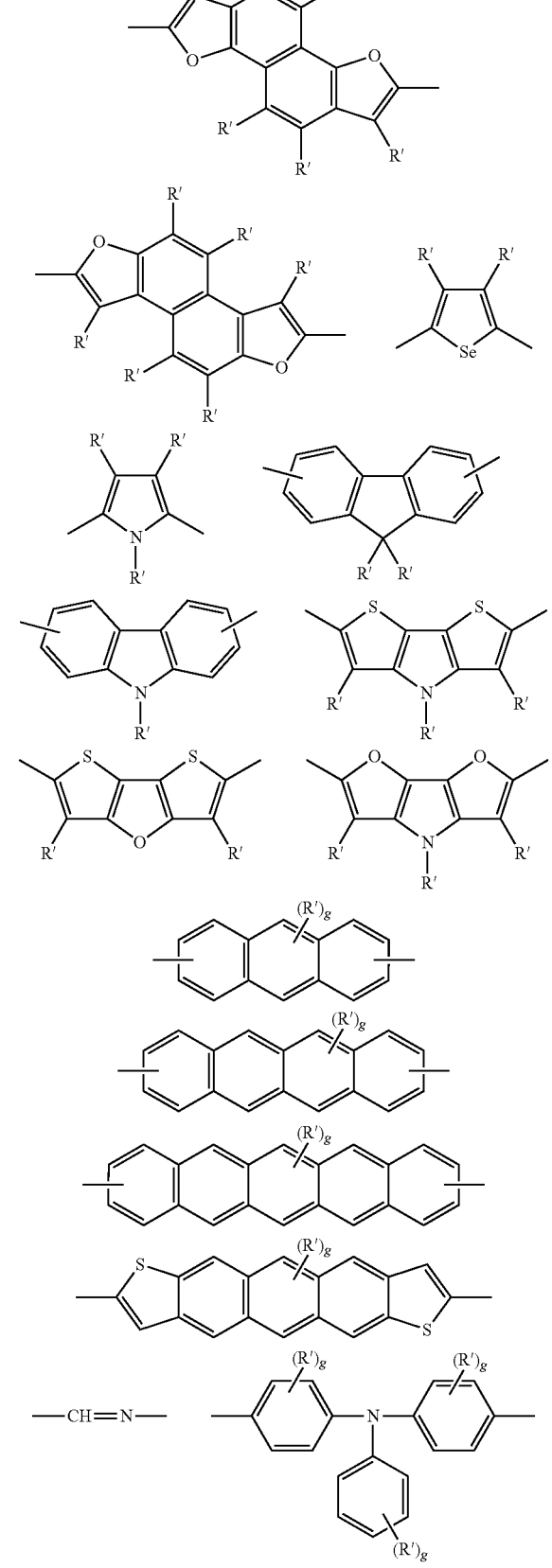

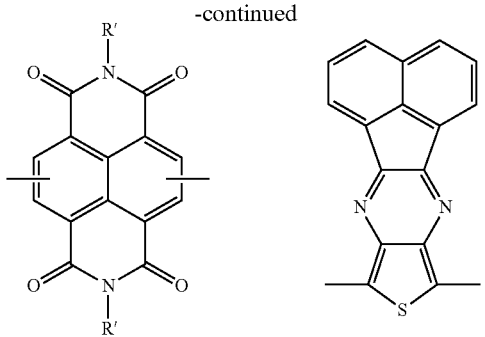

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$; and g is from 3 to 12.

The polymer may have the structure of one of Formulas (1)-(41), as described further herein. In specific embodiments of these polymers, $R_1$ and $R_2$ are the same. For example, $R_1$ and $R_2$ may both be alkyl. In other embodiments, x is at least 1.

In some particular embodiments, each Ar unit is independently selected from the group consisting of:

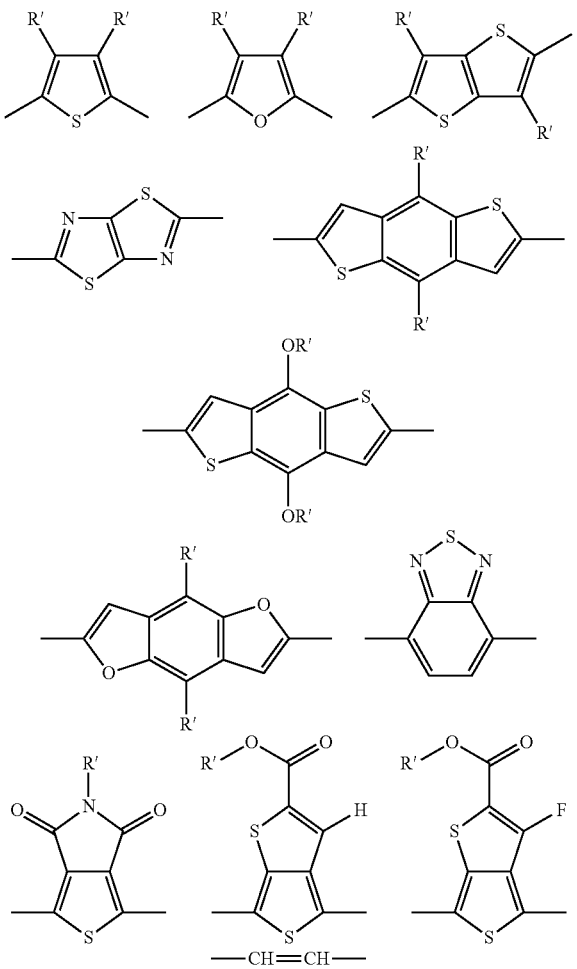

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$.

In other desirable embodiments, x is at least 1, and at least one Ar unit is a thiophene unit.

Also disclosed in embodiments is a semiconductor composition comprising a polymer of Formula (I). The semiconductor composition may, in further embodiments, comprise a solvent.

Also disclosed is an electronic device comprising a semiconducting layer, the semiconducting layer comprising a polymer of Formula (I).

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
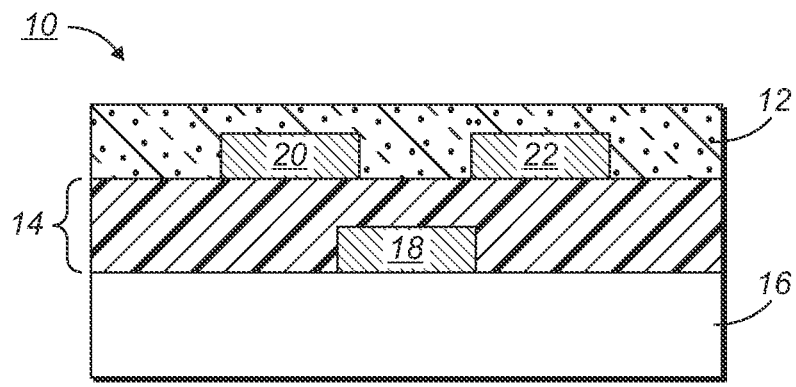
FIG. 1 is a diagram of a first embodiment of a TFT according to the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range of "from about 2 to about 10" also discloses the range "from 2 to 10."

The term "comprising" is used herein as requiring the presence of the named component and allowing the presence of other components. The term "comprising" should be construed to include the term "consisting of", which allows the presence of only the named component, along with any impurities that might result from the manufacture of the named component.

The present disclosure relates to semiconductor polymers as disclosed herein. The semiconductor polymers exhibit good solubility. Compositions comprising the semiconductor polymers are also disclosed. A semiconducting layer formed from the composition is very stable in air and has high mobility. These semiconductor compositions are useful for forming layers in electronic devices, such as thin-film transistors (TFTs).

FIG. 1 illustrates a bottom-gate bottom-contact TFT configuration according to the present disclosure. The TFT 10 comprises a substrate 16 in contact with the gate electrode 18 and a gate dielectric layer 14. The gate electrode 18 is depicted here atop the substrate 16, but the gate electrode could also be located in a depression within the substrate. It is important that the gate dielectric layer 14 separates the gate electrode 18 from the source electrode 20, drain electrode 22, and the semiconducting layer 12. The semiconducting layer 12 runs over and between the source and drain electrodes 20 and 22. The semiconductor has a channel length between the source and drain electrodes 20 and 22.

Figure 2:
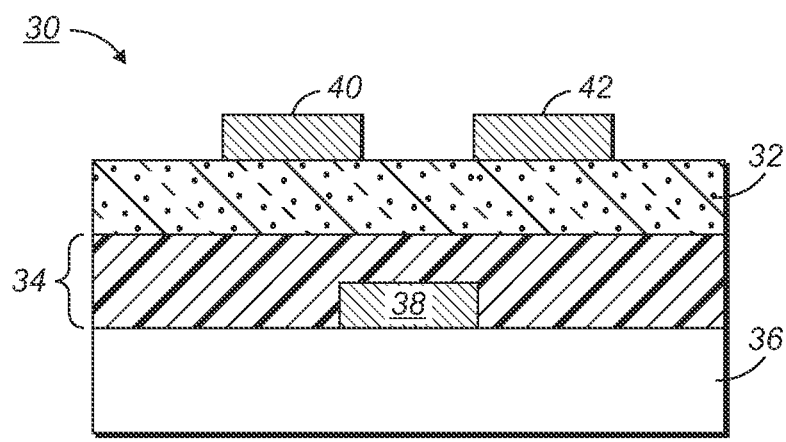
FIG. 2 is a diagram of a second embodiment of a TFT according to the present disclosure.

FIG. 2 illustrates another bottom-gate top-contact TFT configuration according to the present disclosure. The TFT 30 comprises a substrate 36 in contact with the gate electrode 38 and a gate dielectric layer 34. The semiconducting layer 32 is placed on top of the gate dielectric layer 34 and separates it from the source and drain electrodes 40 and 42.

Figure 3:
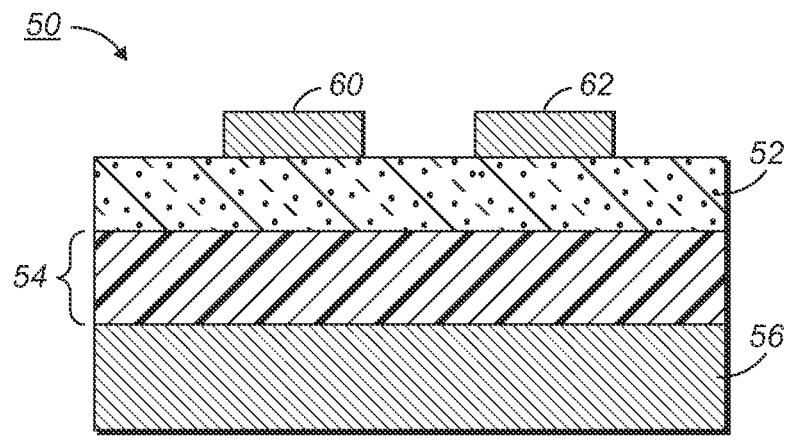
FIG. 3 is a diagram of a third embodiment of a TFT according to the present disclosure.

FIG. 3 illustrates a bottom-gate bottom-contact TFT configuration according to the present disclosure. The TFT 50 comprises a substrate 56 which also acts as the gate electrode and is in contact with a gate dielectric layer 54. The source electrode 60, drain electrode 62, and semiconducting layer 52 are located atop the gate dielectric layer 54.

Figure 4:
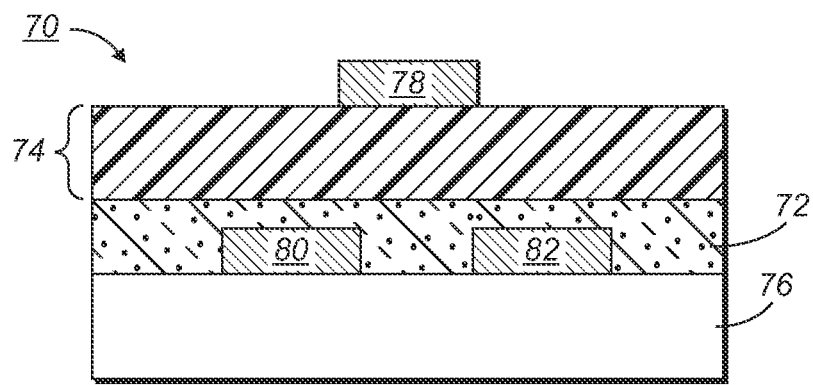
FIG. 4 is a diagram of a fourth embodiment of a TFT according to the present disclosure.

FIG. 4 illustrates a top-gate top-contact TFT configuration according to the present disclosure. The TFT 70 comprises a substrate 76 in contact with the source electrode 80, drain electrode 82, and the semiconducting layer 72. The semiconducting layer 72 runs over and between the source and drain electrodes 80 and 82. The gate dielectric layer 74 is on top of the semiconducting layer 72. The gate electrode 78 is on top of the gate dielectric layer 74 and does not contact the semiconducting layer 72.

The semiconducting polymer has the structure of Formula (I):

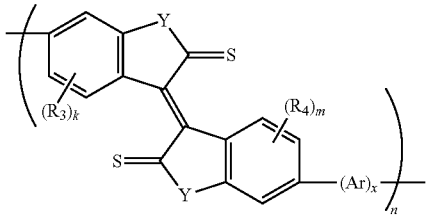

Formula (I)

wherein each Y is independently O or N—R$_5$, wherein each R$_5$ is independently hydrogen, alkyl, substituted alkyl, aryl, or substituted aryl; each R$_3$ and R$_4$ is independently alkyl, substituted alkyl, aryl, substituted aryl, heteroaryl, substituted heteroaryl, halogen, alkoxy, alkylthio, trialkylsilyl, —CN, or —NO$_2$; k and m are independently 0, 1, 2, or 3; each Ar is independently ethenyl, ethynyl, aryl, substituted aryl, heteroaryl, or substituted heteroaryl; x is from 0 to 8; and wherein n is the number of repeating units and is from 2 to about 5,000. In more specific embodiments, n is from 5 to about 5,000.

The term "alkyl" refers to a radical composed entirely of carbon atoms and hydrogen atoms which is fully saturated. The alkyl radical may be linear, branched, or cyclic. The alkyl radical can be univalent or divalent, i.e. can bond to one or two different non-hydrogen atoms.

The term "ethenyl" refers to the radical —CH═CH—.
The term "ethynyl" refers to the radical —C≡O—.
The term "aryl" refers to an aromatic radical composed entirely of carbon atoms and hydrogen atoms. When aryl is described in connection with a numerical range of carbon atoms, it should not be construed as including substituted aromatic radicals. For example, the phrase "aryl containing from 6 to 10 carbon atoms" should be construed as referring to a phenyl group (6 carbon atoms) or a naphthyl group (10 carbon atoms) only, and should not be construed as including a methylphenyl group (7 carbon atoms). The aryl radical may be univalent or divalent.

The term "heteroaryl" refers to an aromatic radical composed of carbon atoms, hydrogen atoms, and one or more heteroatoms. The carbon atoms and the heteroatoms are present in a cyclic ring or backbone of the radical. The heteroatoms are selected from O, S, Se and N. Exemplary heteroaryl radicals include furyl, thienyl and pyridyl.

The term "substituted" refers to at least one hydrogen atom on the named radical being substituted with another functional group, such as halogen, —CN, —NO$_2$, —COOH, and —SO$_3$H. An exemplary substituted alkyl group is a perhaloalkyl group, wherein one or more hydrogen atoms in an alkyl group are replaced with halogen atoms, such as fluorine, chlorine, iodine, and bromine. Besides the aforementioned functional groups, an alkyl group may also be substituted with an aryl or heteroaryl group. An aryl or heteroaryl group may also be substituted with alkyl or alkoxy. Exemplary substituted aryl groups include methylphenyl and methoxyphenyl. Exemplary substituted heteroaryl groups include 3-methylthienyl.

Generally, the alkyl groups independently contain from 1 to 30 carbon atoms. Similarly, the aryl groups independently contain from 6 to 30 carbon atoms. The heteroaryl groups contain from 2 to 30 carbon atoms.

Specific exemplary alkyl groups include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, cyclopentyl, cyclohexyl, cycloheptyl, t-butyl, isopentyl, isopropyl, 2-octyl-n-dodecyl, and isomers thereof.

Specific exemplary aryl and substituted aryl groups include phenyl, polyphenyl, and naphthyl; alkoxyphenyl groups, such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl, and perfluorosubstituted aryl groups such as perfluoromethylphenyl.

Specific exemplary heteroaryl groups include thiophene, furan, oxazole, isoxazole, pyridine, thiazole, isothiazole, imidazole, triazole, pyrazole, furazan, thiadiazole, oxadiazole, pyridazine, pyrimidine, pyrazine, indole, isoindole, indazole, chromene, quinoline, isoquinoline, cinnoline, quinazoline, quinoxaline, naphthylidine, phthalazine, purine, pteridine, thienofuran, thienothiophene, imidazothiazole, benzofuran, benzothiophene, benzoxazole, benzthiazole, benzthiadiazole, benzimidazole, imidazopyridine, pyrrolopyridine, pyrrolopyrimidine, and pyridopyrimidine.

In more specific embodiments, x is at least 1. In some embodiments, x is from 0 to 4. In other embodiments, k and m are both zero. In particular embodiments, x is at least 1 and k=m=0. It is particularly contemplated that in some embodiments, both Y groups are N—R$_5$, with the R$_5$ groups being the same. In particular embodiments, both R$_5$ groups are alkyl.

Each Ar unit may be independently selected from the group consisting of the following moieties:

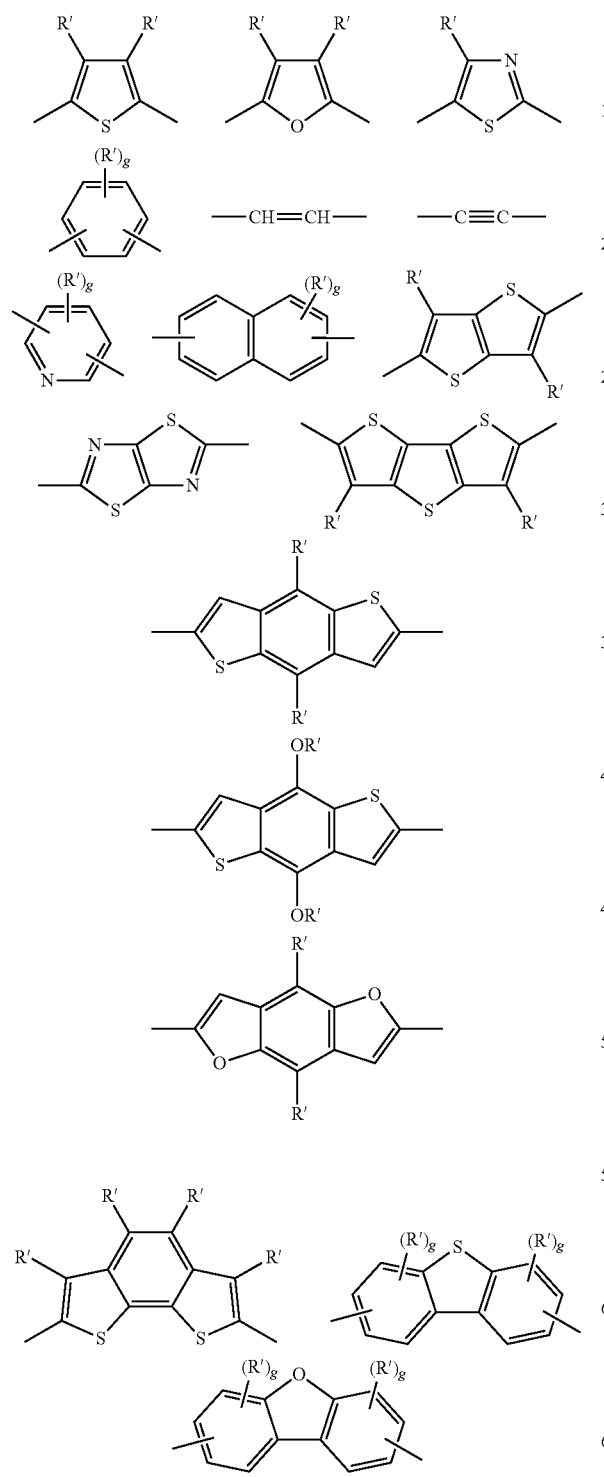
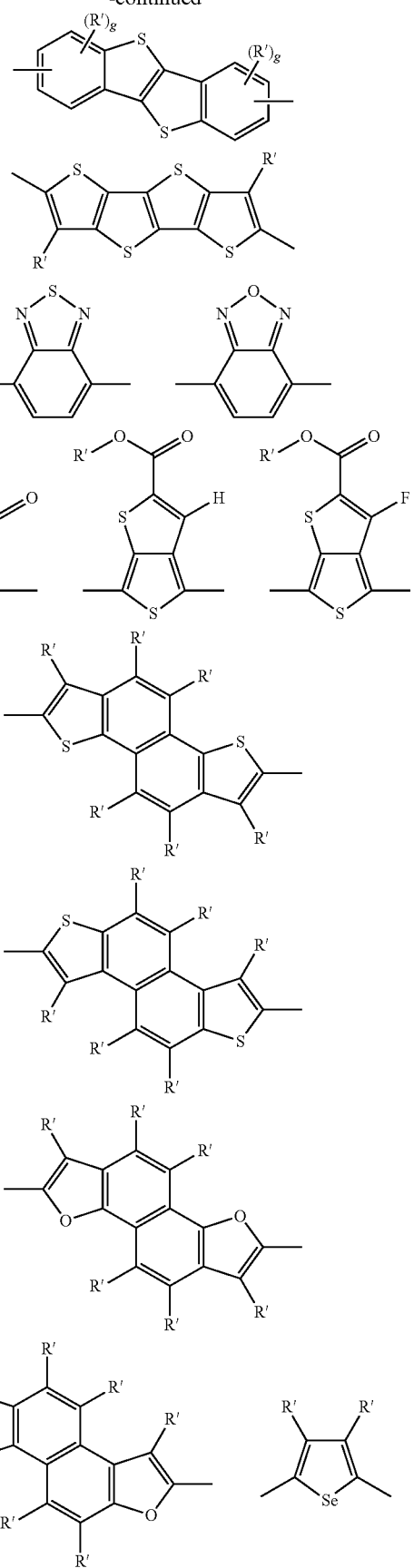

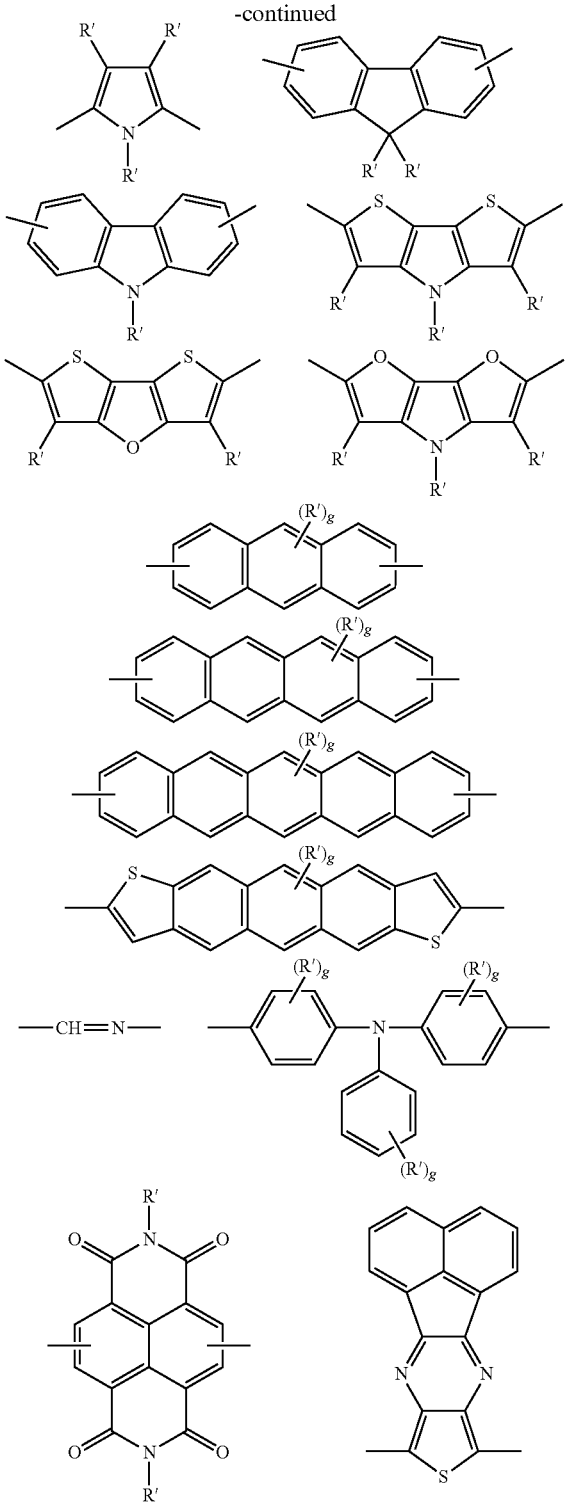

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$; and g is from 3 to 12. Please note the (R')$_g$ notation is used to refer to all of the possible substituent locations without drawing them on certain Ar units, and is used for simplicity and clarity in visualizing the structure of such units.

The term "alkoxy" refers to an alkyl radical which is attached to an oxygen atom, e.g. —O—C$_n$H$_{2n+1}$. The oxygen atom attaches to the core of the compound.

The term "alkylthio" refers to an alkyl radical which is attached to a sulfur atom, e.g. —S—C$_n$H$_{2n+1}$. The sulfur atom attaches to the core of the compound.

The term "trialkylsilyl" refers to a radical composed of a tetravalent silicon atom having three alkyl radicals attached to the silicon atom, i.e. —Si(R)$_3$. The three alkyl radicals may be the same or different. The silicon atom attaches to the core of the compound.

In particular embodiments, x is at least 1 and at least one Ar unit is thieno[3,2-b]thiophene:

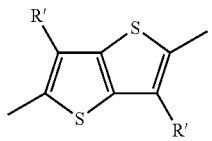

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$.

In more specific embodiments, each Ar unit is selected from the group consisting of:

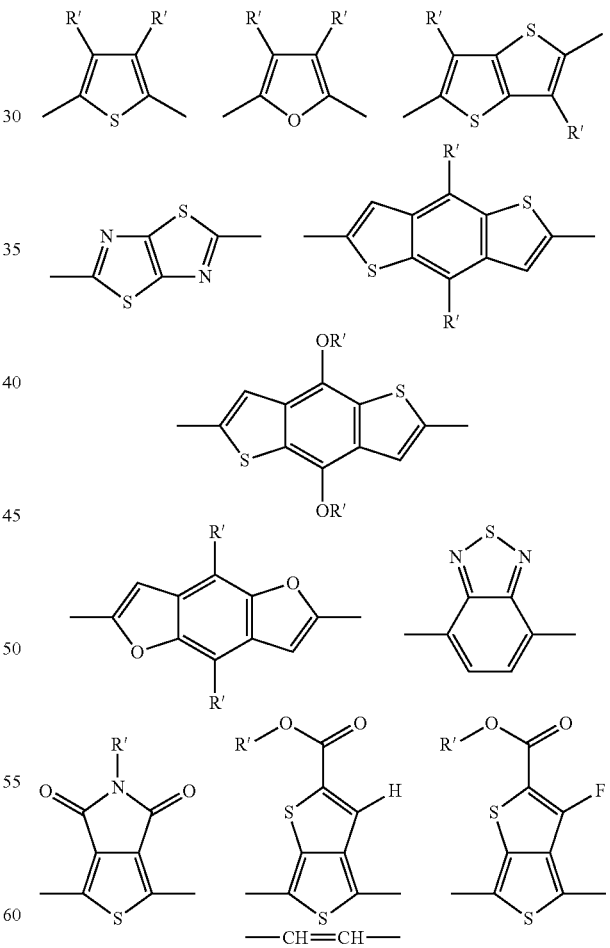

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$.

Exemplary semiconducting polymers of Formula (I) include those of Formulas (1)-(41):
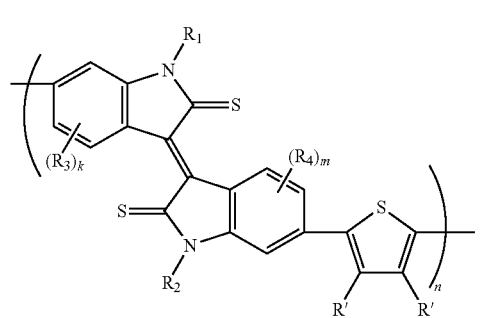
Formula (1)
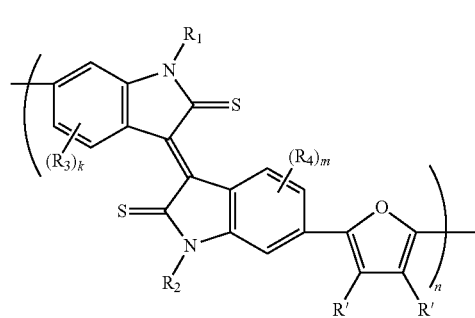
Formula (2)
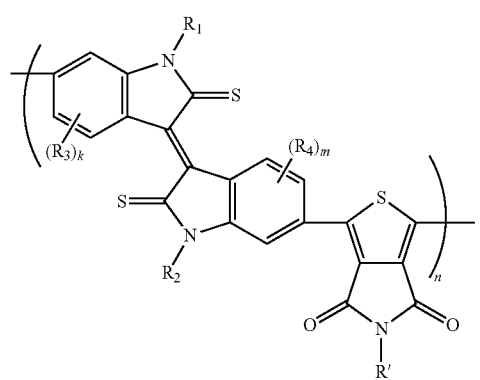
Formula (3)
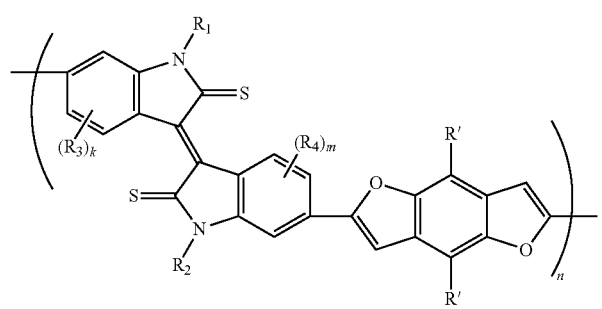
Formula (4)
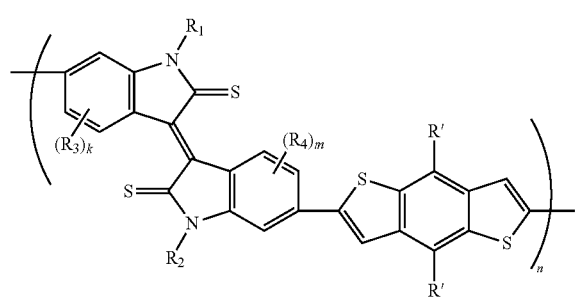
Formula (5)
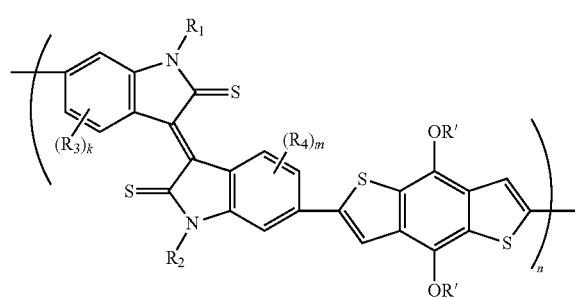
Formula (6)
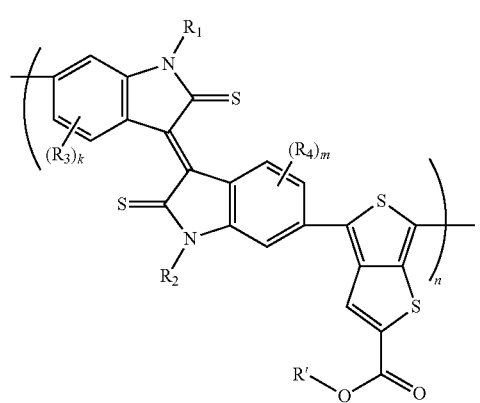
Formula (7)
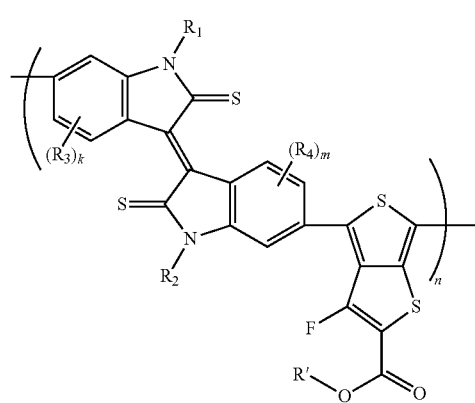
Formula (8)

-continued
Formula (9)
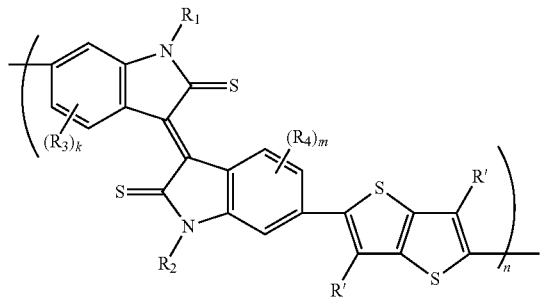
Formula (10)
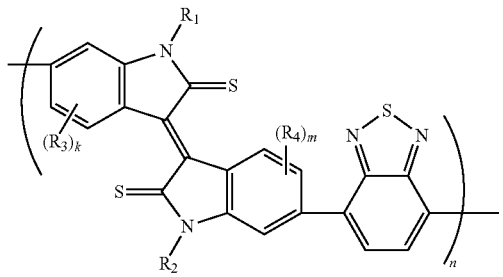
Formula (11)
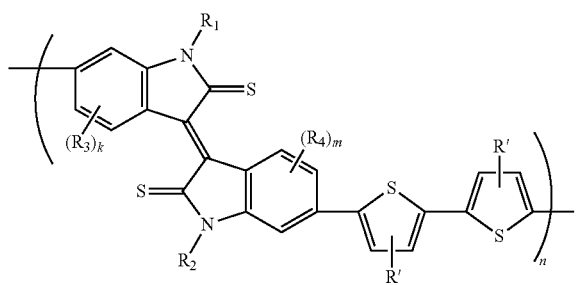
Formula (12)
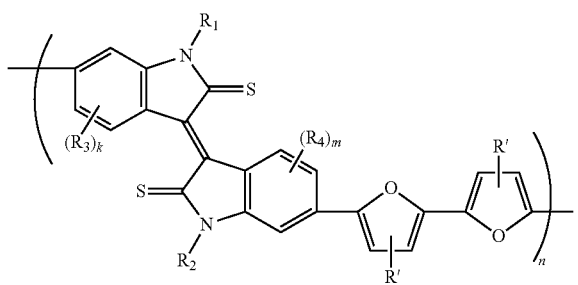
Formula (13)
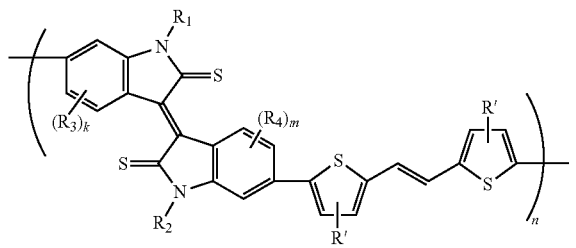
Formula (14)
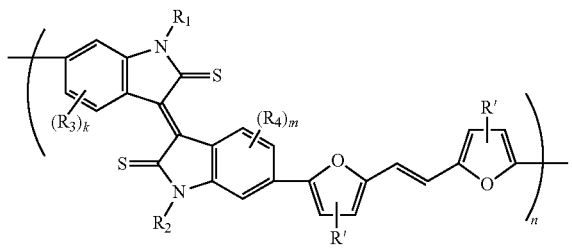
Formula (15)
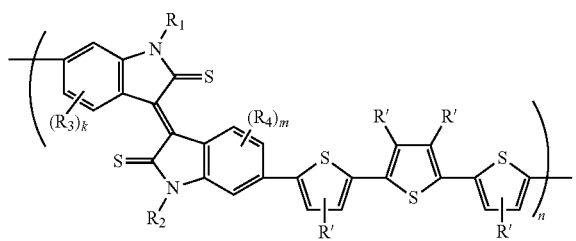
Formula (16)
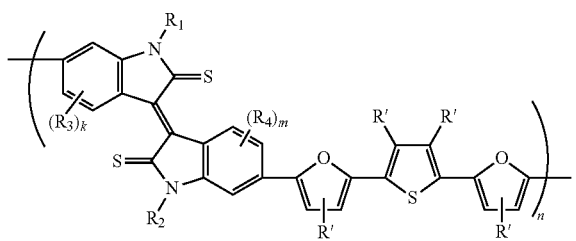
Formula (17)
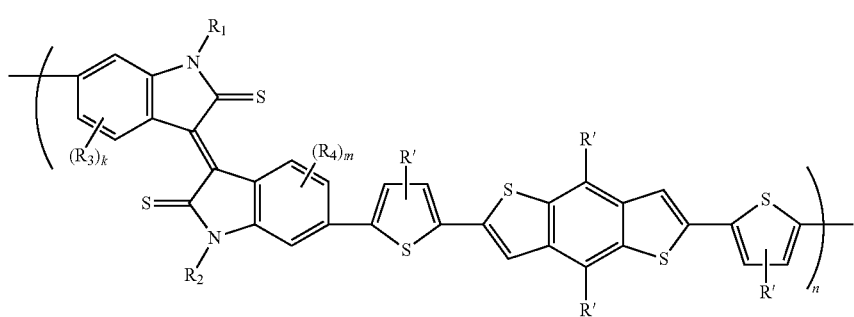

Formula (18)
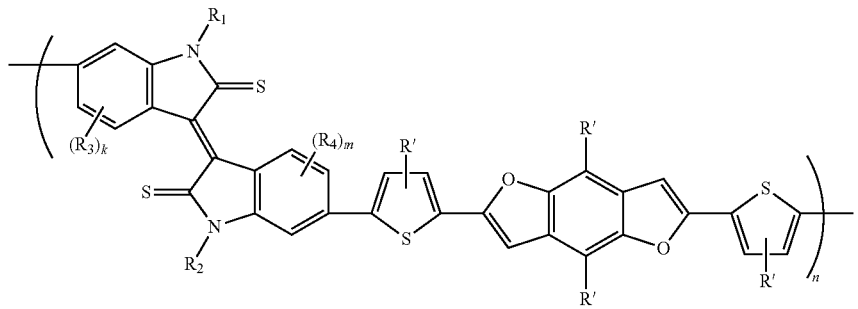
Formula (19)
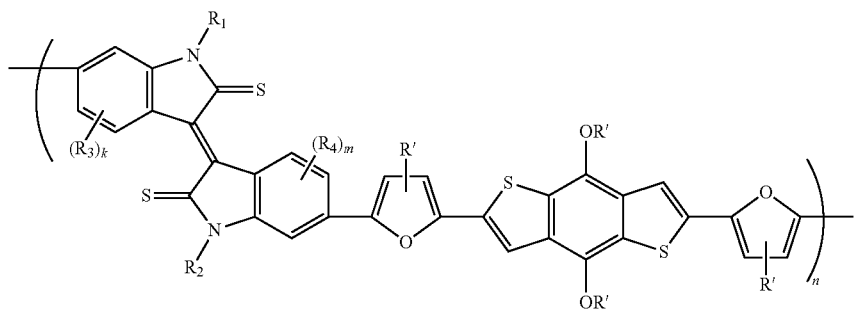
Formula (20)
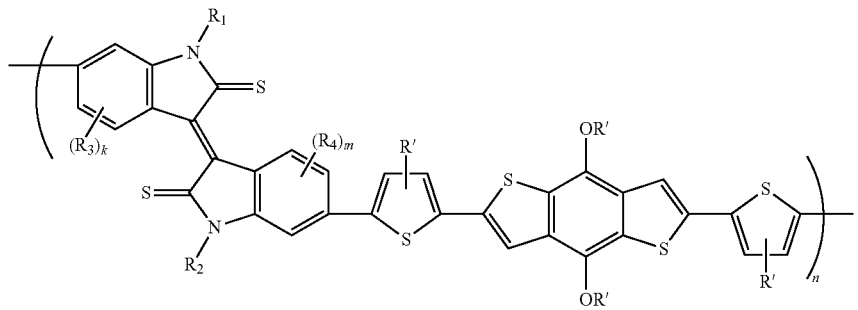
Formula (21)
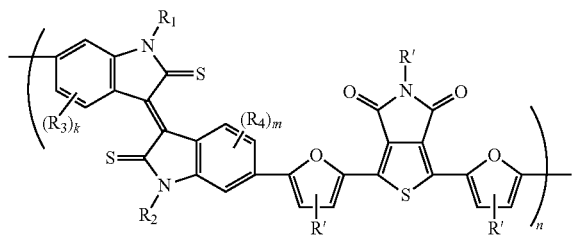
Formula (22)
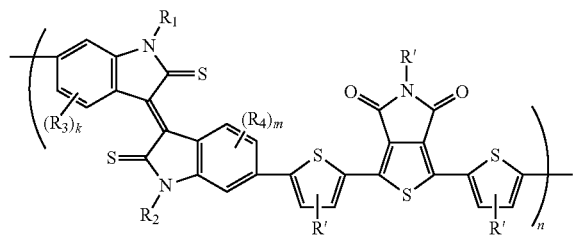
Formula (23)
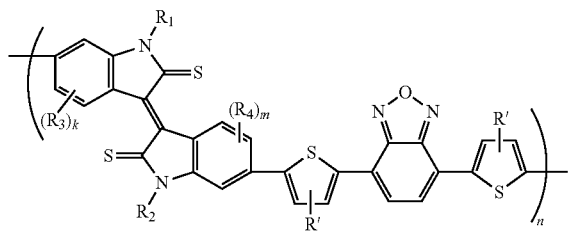

-continued
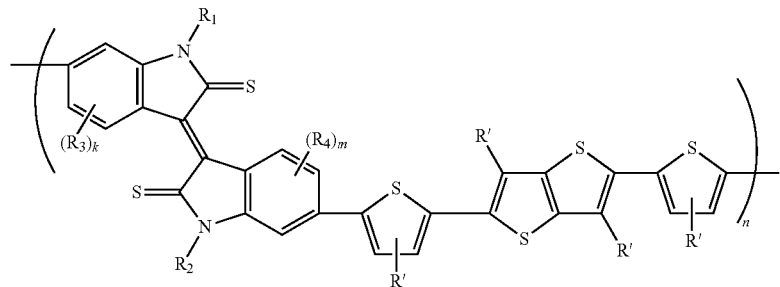
Formula (24)
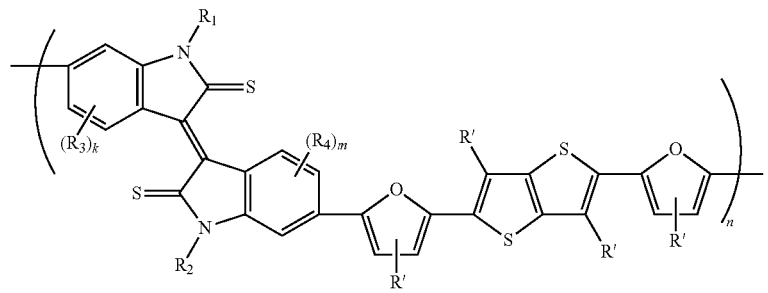
Formula (25)
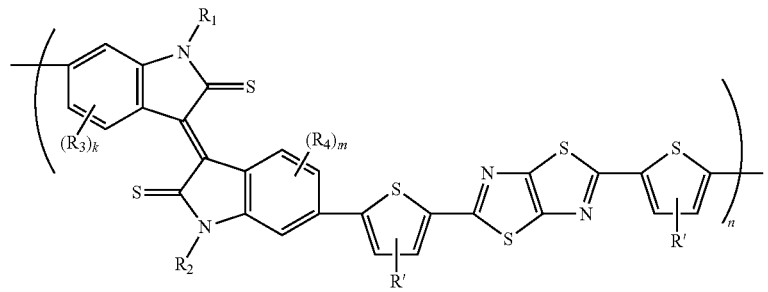
Formula (26)
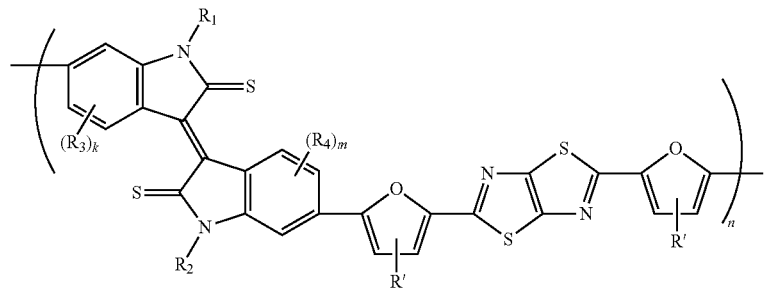
Formula (27)
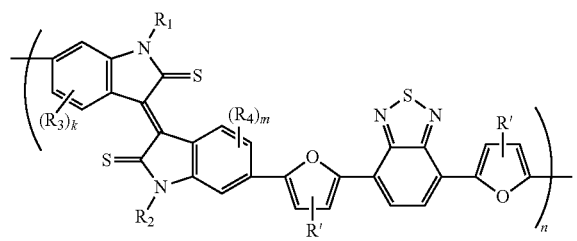
Formula (28)
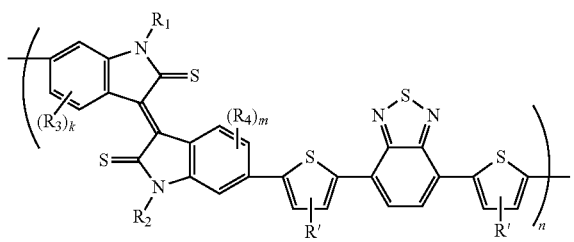
Formula (29)

-continued
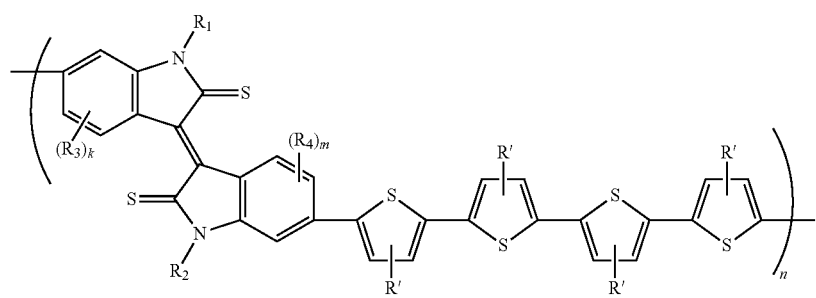
Formula (30)
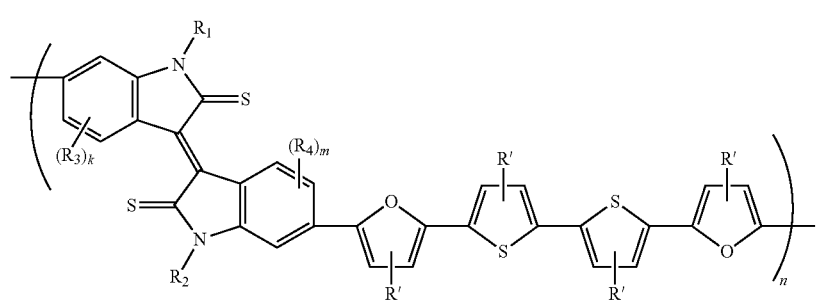
Formula (31)
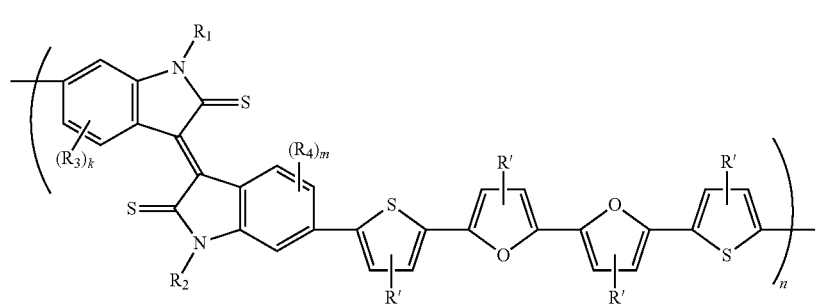
Formula (32)
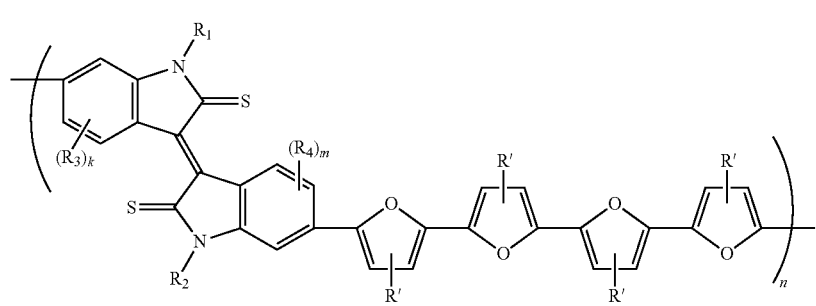
Formula (33)
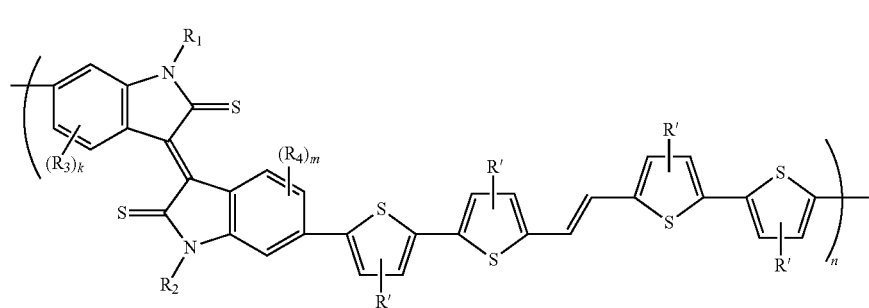
Formula (34)

-continued
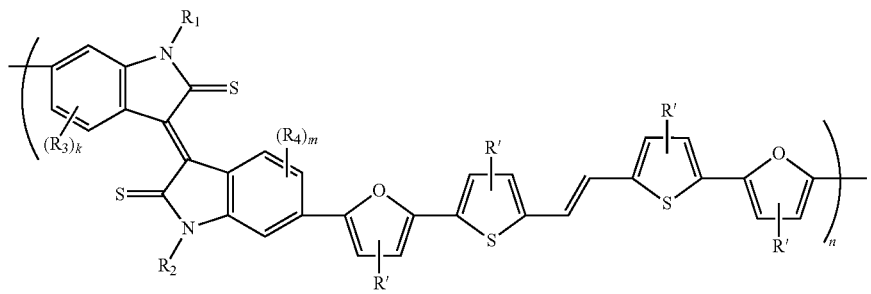
Formula (35)
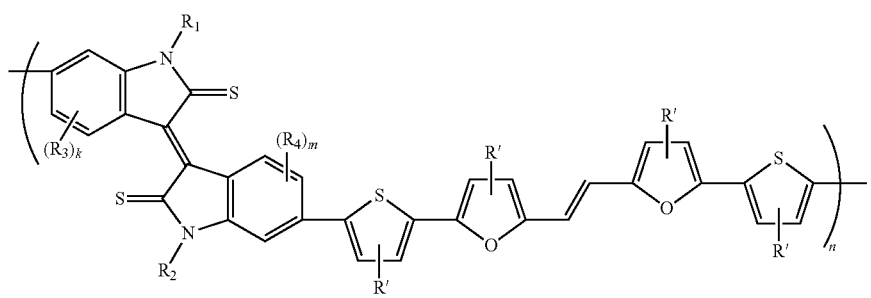
Formula (36)
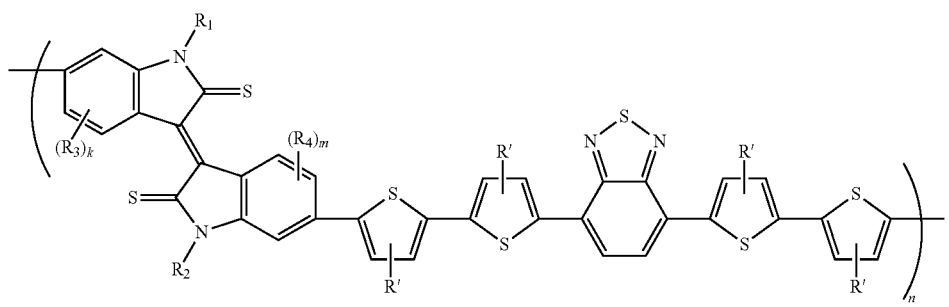
Formula (37)
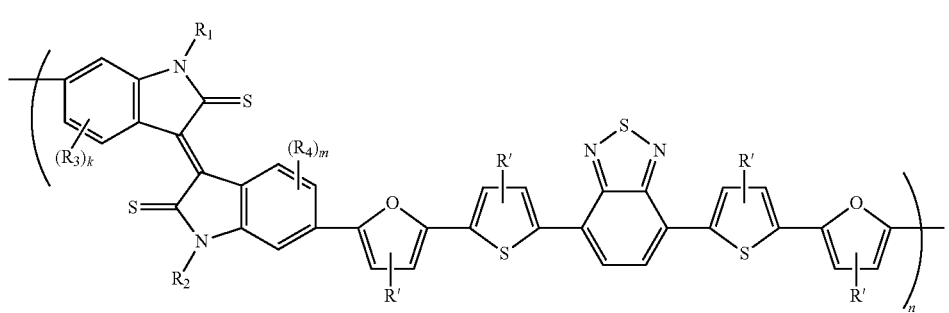
Formula (38)
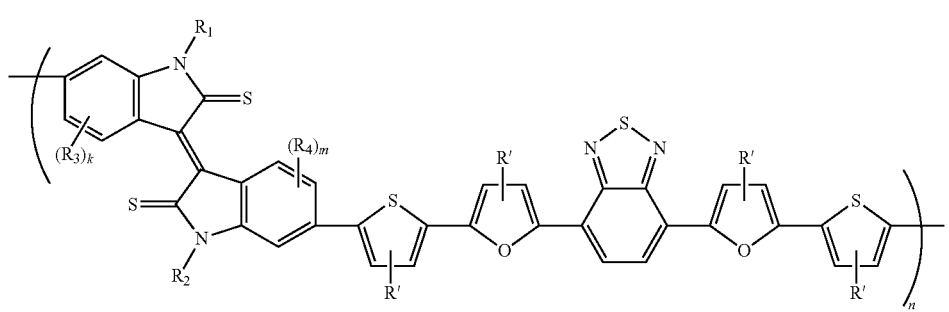
Formula (39)

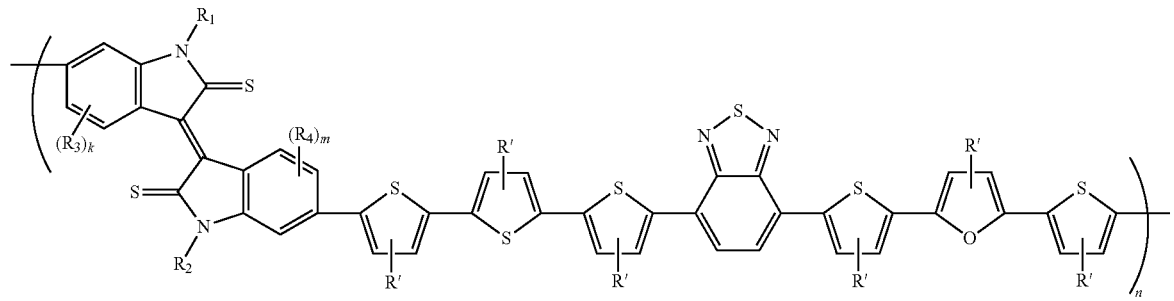

Formula (40)

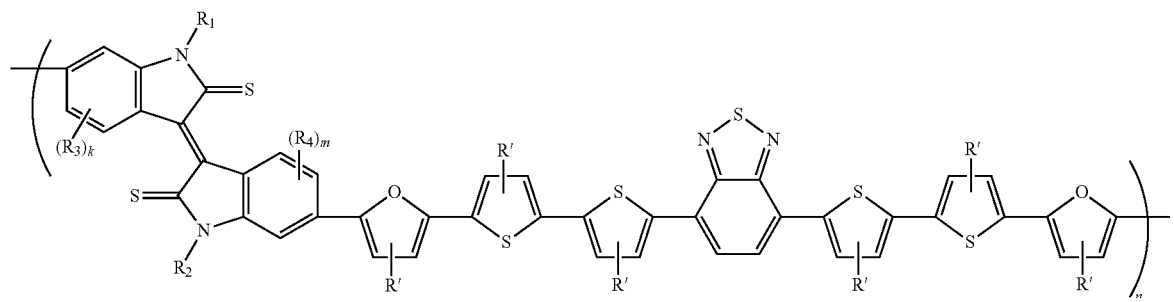

Formula (41)

wherein $R_1$ and $R_2$ are independently hydrogen, alkyl, substituted alkyl, aryl, or substituted aryl;

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$;

each $R_3$ and $R_4$ is independently alkyl, substituted alkyl, aryl, substituted aryl, heteroaryl, substituted heteroaryl, halogen, alkoxy, alkylthio, trialkylsilyl, —CN, or —NO$_2$; and k and m are independently 0, 1, 2, or 3.

In some embodiments, at least one of $R_1$ and $R_2$ is not hydrogen.

In embodiments, the semiconductor polymer of Formula (I) has a band gap of from about 1.1 to about 3.2 eV, including from about 1.2 to about 2.8 eV, or from about 1.2 to about 2.0 eV. In some embodiments, the semiconductor polymer of Formula (I) has a small band gap from about 1.0 to about 2.0 eV. The semiconductor polymer has a crystalline, semicrystalline, or liquid crystalline structure in the semiconductor layer. Crystallinity can be determined for example using an X-ray diffraction method or differential scanning calorimetry method.

Exemplary polymers of the present disclosure may be synthesized by a two-step process. An exemplary process for synthesizing a polymer of Formula (I) is discussed below.

In the first step, a dibromoisothioindigo A may be converted to a dithioisoindigo B using Lawesson's reagent. The first step is illustrated in Reaction 1:

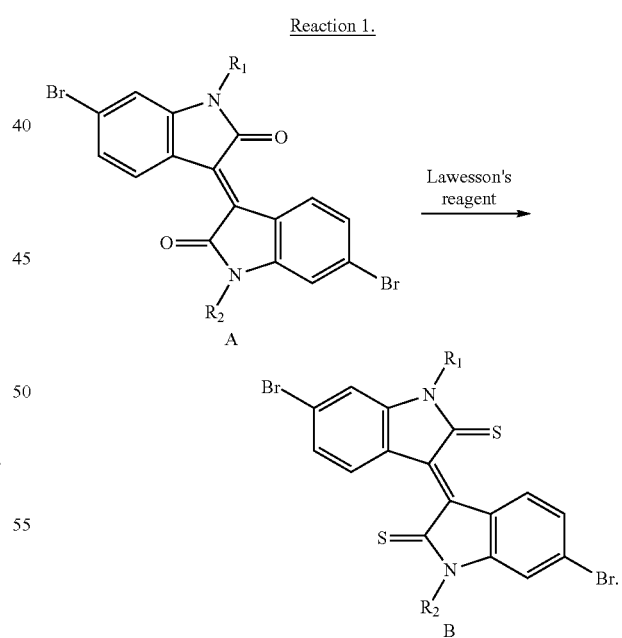

Reaction 1.

In the second step, the dithioisoindigo B produced in Reaction 1 and a bifunctional organotin or organoboron reagent C may be reacted in the presence of a palladium catalyst to form a polymer D of Formula (I). The second step is a polycondensation reaction and is illustrated in Reaction 2:

Reaction 2.

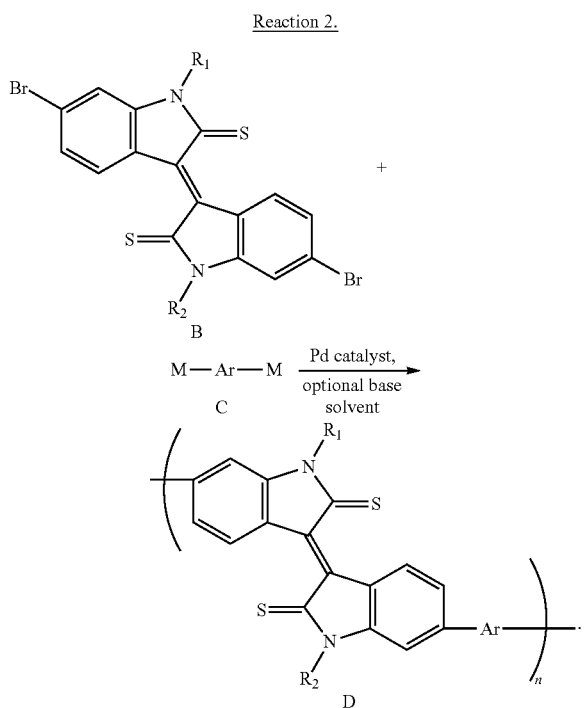

Reaction 2 may be performed in solution using a catalyst suitable for coupling reactions or for polycondensation reactions, optionally in the presence of copper(I) iodide. A suitable coupling catalyst is a palladium-based catalyst, e.g., a tetrakis(triarylphosphonium)-palladium catalyst, such as tetrakis(triphenylphosphine)palladium(0) (Pd(PPh$_3$)$_4$), Pd(PPh$_3$)$_2$Cl$_2$, PdOAc$_2$, Pd(dba)$_3$:P(o-Tol)$_3$, or derivatives thereof. Usually, the catalyst is added in a molar ratio of compound C to the catalyst in the range of from about 1000:1 to about 10:1, e.g., from about 100:1 to about 30:1. A suitable solvent for the reaction may be tetrahydrofuran (THF), dioxane, 1-methyl-2-pyrrolidinone (NMP), dimethylacetamide (DMA), dimethylformamide (DMF), toluene, xylenes, water, or mixtures thereof. For suitable solvent mixtures containing water, an optional phase transfer catalyst may be added. The reaction may be carried out under reflux at a temperature which is at or slightly above the boiling point of the solvent.

The comonomer shown here as compound C generally has the formula M-Ar-M, where Ar is the conjugated moiety (i.e. Ar unit) and M is a reactive group that depends on the polycondensation reaction. For example, in a Suzuki reaction, the reactive group M may be one of those shown below:

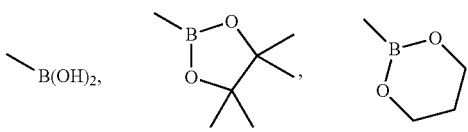

An additional base, such as K$_2$CO$_3$, Cs$_2$CO$_3$, K$_3$PO$_4$, KF, or CsF, is also required for a Suzuki reaction. Alternatively, in a Stifle reaction, the reactive group M is a trialkylstannyl group such as —SnMe$_3$ or —Sn(n-Bu)$_3$.

The copolymers thus formed may have a weight average molecular weight M$_w$ in the range of from about 700 to about 1,000,000. In some embodiments, the copolymer of Formula (I) has a M$_w$ of about 1,000 to about 800,000, including from about 5,000 to about 100,000.

The copolymers thus formed may have a polydispersity index (PDI) in the range of from about 2 to about 10. In some embodiments, the copolymer of Formula (I) has a PDI of about 2 to about 5, including from about 2 to about 3.

Semiconductor compositions comprising the semiconducting polymers of Formula (I) are also disclosed. The semiconductor compositions generally include a solvent in which the polymer is soluble. Exemplary solvents may include chlorinated solvents such as chlorobenzene, chlorotoluene, dichlorobenzene, dichloroethane, and the like; alcohols and diols such as propanol, butanol, hexanol, hexanediol, etc.; hydrocarbons or aromatic hydrocarbons such as hexane, heptane, toluene, xylene, mesitylene, trimethyl benzene, ethyl benzene, tetrahydronaphthalene, decalin, methyl naphthalene, etc.; ketones such as acetone, methyl ethyl ketone, etc.; acetates, such as ethyl acetate; pyridine, tetrahydrofuran, and the like.

In specific embodiments, the solvent used with the polymer of Formula (I) is a non-aromatic halogenated hydrocarbon solvent containing at least 2 carbon atoms and at least 3 halogen atoms. The phrase "non-aromatic" means that the compound used as the solvent is not aromatic. In other words, the compound does not obey Hückel's rule and does not have a delocalized conjugated pi system with a coplanar structure. The term "halogenated" means that the compound contains at least 3 halogen atoms. Halogen atoms include fluorine, chlorine, bromine, and iodine. The term "hydrocarbon" means that the solvent contains carbon atoms and hydrogen atoms, and includes alkanes, alkenes, and alkynes. In specific embodiments, the halogen atom is a chlorine atom.

In some embodiments, the non-aromatic halogenated hydrocarbon solvent contains at least 3 carbon atoms, or at least 4 carbon atoms. In some embodiments, the non-aromatic halogenated hydrocarbon solvent contains at least 4 halogen atoms, or at least 5 halogen atoms. In particular embodiments, the non-aromatic halogenated hydrocarbon solvent contains at least 2 carbon atoms and at least 4 halogen atoms. In others, the non-aromatic halogenated hydrocarbon solvent contains at least 3 carbon atoms and at least 3 halogen atoms. In still others, the non-aromatic halogenated hydrocarbon solvent contains at least 1 hydrogen atom. In particular, embodiments, the non-aromatic halogenated hydrocarbon solvent contains only carbon, hydrogen, and chlorine atoms.

In specific embodiments, the non-aromatic halogenated hydrocarbon solvent is selected from the group consisting of 1,1,2,2-tetrachloroethane (CAS #79-34-5); 1,1,1,2-tetrachloroethane (CAS #630-20-6); 1,1,1,2,2-pentachloroethane (CAS #76-01-7); pentaerythrityl tetrachloride (CAS #3228-99-7); 1,2,3,4-tetrachlorobutane (CAS #3405-32-1); 1,2,3-trichloropropane (CAS #96-18-4); 1,1,2-trichloroethane (CAS #79-00-5); and 1,1,2-trichloroethylene (CAS #79-01-6). Of course, more than one such non-aromatic halogenated hydrocarbon solvent may also be present in the semiconductor composition if desired. In other particular embodiments, the non-aromatic halogenated hydrocarbon solvent is a chloroalkane. Put another way, the only halogen present is chlorine, and the carbon atoms are all single bonds. Desirably, the non-aromatic halogenated hydrocarbon solvent is 1,1,2,2-tetrachloroethane.

Without being limited by theory, it is believed that the Hansen solubility parameters of the solvent should have a large dispersion force component ($\delta_D$), a relatively large polar component ($\delta_P$), and a relatively large hydrogen bonding component ($\delta_H$). In this regard, aromatic halogenated hydrocarbon solvents usually have a low hydrogen bonding component. The preferred non-aromatic halogenated hydrocarbon solvents can have a dispersion force component of at least 18.0 MPa$^{1/2}$. In embodiments, the non-aromatic halogenated hydrocarbon solvent has a hydrogen bonding component $\delta_H$ of 5.0 MPa$^{1/2}$ or greater. In embodiments, the non-aromatic halogenated hydrocarbon solvent has a hydrogen bonding component $\delta_H$ of at least 5.0 MPa$^{1/2}$ and a dispersion force component of at least 18.0 MPa$^{1/2}$. In other embodiments, the non-aromatic halogenated hydrocarbon solvent has a boiling point of at least 70° C., including at least 100° C. or at least 120° C. Generally, the non-aromatic halogenated hydrocarbon solvent has a maximum boiling point of about 300° C.

If desired, other solvents may also be present in the semiconductor composition. Such solvents may include toluene, xylene, mesitylene, ethylbenzene, diethylbenzene, trimethyl benzene, methyl ethylbenzene, tetrahydronaphthalene, chlorobenzene, dichlorobenzene, trichlorobenzene, chlorotoluene, methyl isobutyl ketone, methyl benzoate, benzyl benzoate, anisole, cyclohexanone, and acetophenone. Other solvents could be used as well, such as organoamines, methanol, ethanol, propanol, butanol, glycols, acetone, tetrahydrofuran (THF), dichloromethane, ethyl acetate, dimethylformamide (DMF), dimethyl sulfoxide (DMSO), acetic acid, acetonitrile, and dioxane. However, the amount of additional solvents (by weight) is always less than the amount of non-aromatic halogenated hydrocarbon solvent. In some particular embodiments, only non-aromatic halogenated hydrocarbon solvents are present in the semiconductor composition as a solvent.

In embodiments, the semiconductor composition comprising the semiconducting polymer of Formula (I) may have a viscosity of from about 1.5 centipoise (cps) to about 1000 cps, including from about 2 to about 100 cps, or from about 2 to about 20 cps.

The semiconducting layer may be formed in an electronic device using conventional processes known in the art. In embodiments, the semiconducting layer is formed using solution depositing techniques. Exemplary solution depositing techniques include spin coating, blade coating, rod coating, dip coating, screen printing, ink jet printing, stamping, stencil printing, screen printing, gravure printing, flexography printing, and the like.

The semiconductor compositions of the present disclosure can be useful in forming the semiconducting layer of various electronic devices, for example, thin film transistors, photovoltaic devices, light emitting diodes, light emitting transistors, sensors, and the like.

The semiconducting layer formed using the semiconductor composition can be from about 5 nanometers to about 1000 nanometers deep, including from about 20 to about 100 nanometers in depth. In certain configurations, such as the configurations shown in FIGS. 1 and 4, the semiconducting layer completely covers the source and drain electrodes. The semiconductor channel width may be, for example, from about 5 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The performance of a TFT can be measured by mobility. The mobility is measured in units of cm$^2$/V·sec; higher mobility is desired. The resulting TFT using the semiconductor composition of the present disclosure may have a field effect mobility of at least 0.01 cm$^2$V·sec. The TFT of the present disclosure may have a current on/off ratio of at least 10$^3$.

A thin film transistor generally includes a substrate, an optional gate electrode, source electrode, drain electrode, and a dielectric layer in addition to the semiconducting layer.

The substrate may be composed of materials including but not limited to silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 0.5 to about 10 millimeters for a rigid substrate such as glass or silicon.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about 10$^{-12}$ Siemens per centimeter (S/cm). The dielectric layer is formed using conventional processes known in the art, including those processes described in forming the gate electrode.

In the present disclosure, the dielectric layer may be surface modified with a surface modifier. Exemplary surface modifiers include organosilanes such as hexamethyldisilazane (HMDS), octyltrichlorosilane (OTS-8), octadecyltrichlorosilane (ODTS-18), and phenyltrichlorosilane (PTS). The semiconducting layer can be directly contacted with this modified dielectric layer surface. The contact may be complete or partial. This surface modification can also be considered as forming an interfacial layer between the dielectric layer and the semiconducting layer.

The gate electrode is composed of an electrically conductive material. It can be a thin metal film, a conducting polymer film, a conducting film made from conducting ink or paste, or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges for example from about 10 to about 200 nanometers for metal films and from about 1 to about 10 micrometers for conductive polymers. Typical materials suitable for use as source and drain electrodes include those of the gate electrode materials such as aluminum, gold, silver, chromium, zinc, indium, conductive metal oxides such as zinc-gallium oxide, indium tin oxide, indium-antimony oxide, conducting polymers and conducting inks. Typical thicknesses of source and drain electrodes are, for example, from about 40 nanometers to about 1 micrometer, including more specific thicknesses of from about 100 to about 400 nanometers.

Typical materials suitable for use as source and drain electrodes include those of the gate electrode materials such as gold, silver, nickel, aluminum, platinum, conducting polymers, and conducting inks. In specific embodiments, the electrode materials provide low contact resistance to the semiconductor. Typical thicknesses are about, for example, from about 40 nanometers to about 1 micrometer with a more specific thickness being about 100 to about 400 nanometers.

The source electrode is grounded and a bias voltage of, for example, about 0 volt to about 80 volts is applied to the drain electrode to collect the charge carriers transported across the semiconductor channel when a voltage of, for example, about +10 volts to about −80 volts is applied to the gate electrode. The electrodes may be formed or deposited using conventional processes known in the art.

If desired, a barrier layer may also be deposited on top of the TFT to protect it from environmental conditions, such as light, oxygen and moisture, etc. which can degrade its electrical properties. Such barrier layers are known in the art and may simply consist of polymers.

The various components of the OTFT may be deposited upon the substrate in any order. Generally, however, the gate electrode and the semiconducting layer should both be in contact with the gate dielectric layer. In addition, the source and drain electrodes should both be in contact with the semiconducting layer. The phrase "in any order" includes sequential and simultaneous formation. For example, the source electrode and the drain electrode can be formed simultaneously or sequentially. The term "on" or "upon" the substrate refers to the various layers and components with reference to the substrate as being the bottom or support for the layers and components which are on top of it. In other words, all of the components are on the substrate, even though they do not all directly contact the substrate. For example, both the dielectric layer and the semiconducting layer are on the substrate, even though one layer is closer to the substrate than the other layer. The resulting TFT has good mobility and good current on/off ratio.

The present disclosure has been described with reference to exemplary embodiments. Obviously, modifications and alterations will occur to others upon reading and understanding the preceding detailed description. It is intended that the present disclosure be construed as including all such modifications and alterations insofar as they come within the scope of the appended claims or the equivalents thereof

The invention claimed is:

1. A polymer of Formula (I):

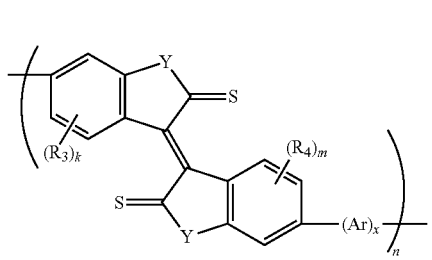

wherein each Y is independently O or N—R$_5$, wherein each R$_5$ is independently hydrogen, alkyl, substituted alkyl, aryl, or substituted aryl;
each R$_3$ and R$_4$ is independently alkyl, substituted alkyl, aryl, substituted aryl, heteroaryl, substituted heteroaryl, halogen, alkoxy, alkylthio, trialkylsilyl, —CN, or —NO$_2$;
k and m are independently 0, 1, 2, or 3;
each Ar is independently ethenyl, ethynyl, aryl, substituted aryl, heteroaryl, or substituted heteroaryl;
x is from 0 to 8; and
wherein n is the number of repeating units and is from 2 to about 5,000.

2. The polymer of claim 1, wherein at least one Ar unit is thieno[3,2-b]thiophene:

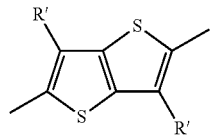

wherein each R' is independently hydrogen, alkyl, substituted alkyl, aryl, substituted aryl, heteroaryl, substituted heteroaryl, halogen, alkoxy, alkylthio, trialkylsilyl, —CN, or —NO$_2$.

3. The polymer of claim 1, wherein each Ar unit is independently selected from the group consisting of:

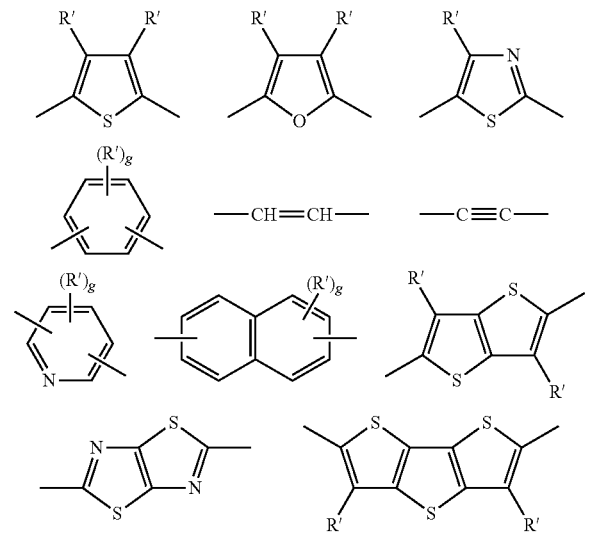

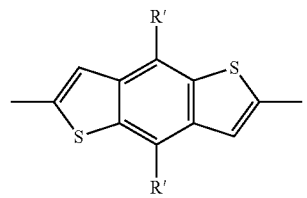

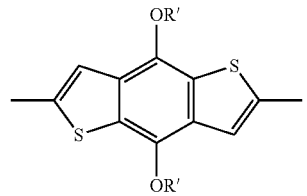

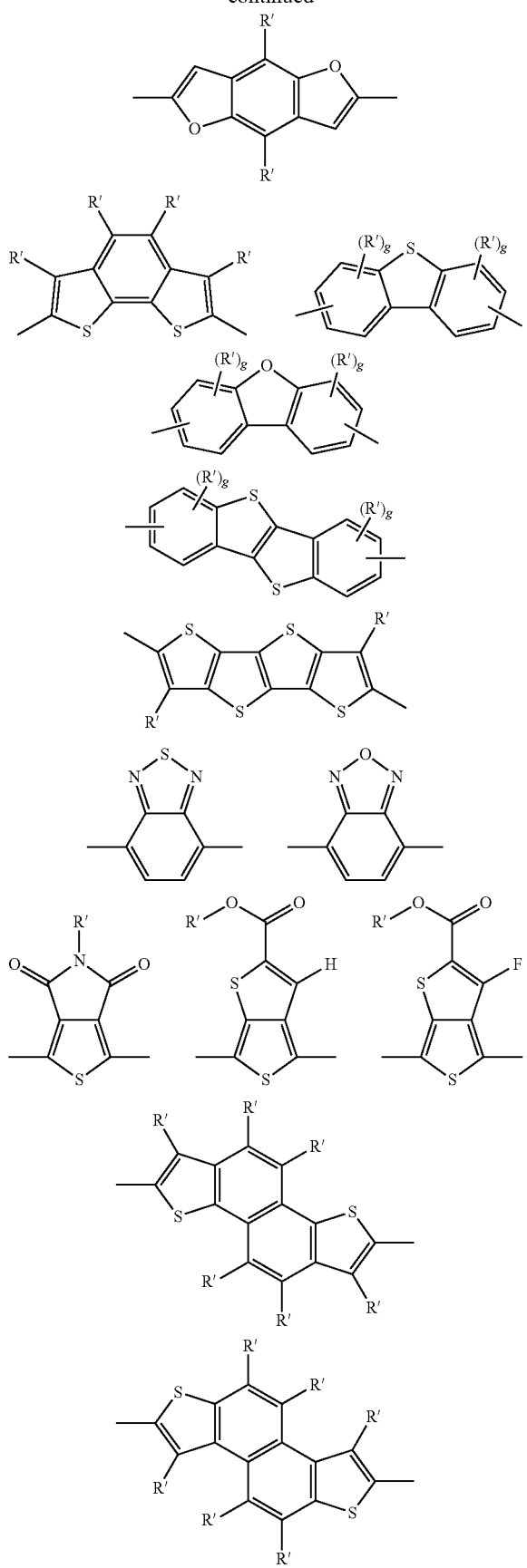
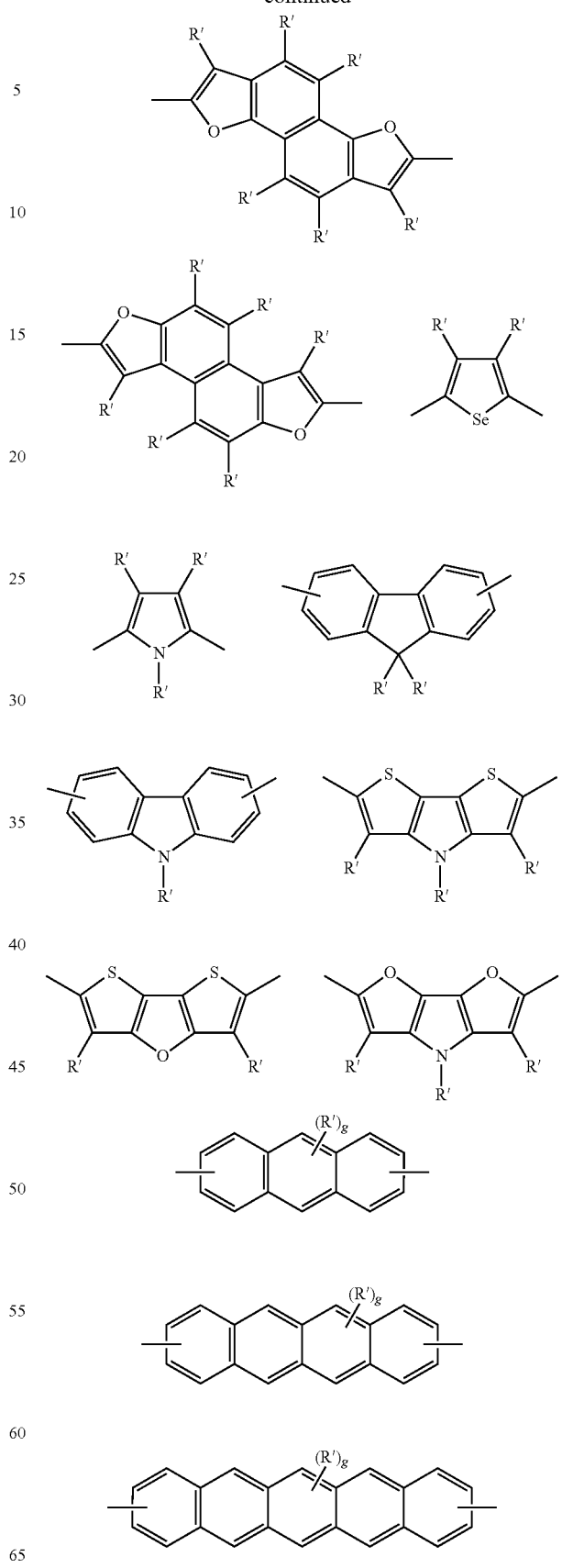

35
-continued
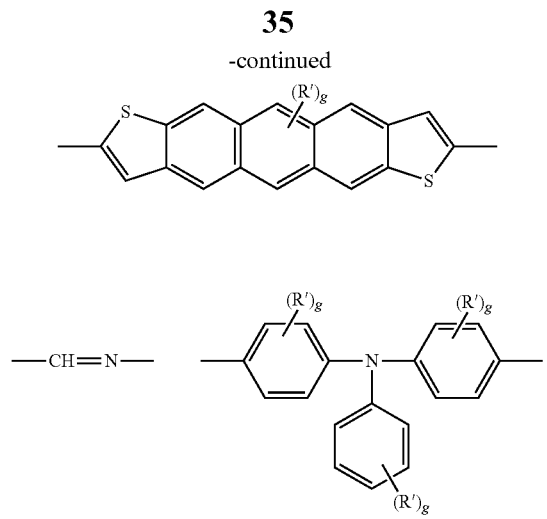
36
-continued
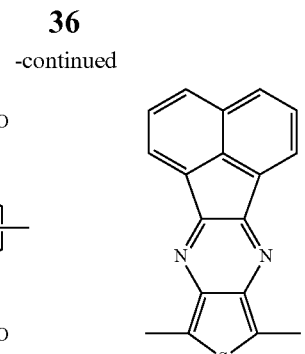
wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$; and g is from 3 to 12.
4. The polymer of claim 1, wherein the polymer has the structure of one of Formulas (1)-(41):
Formula (1)
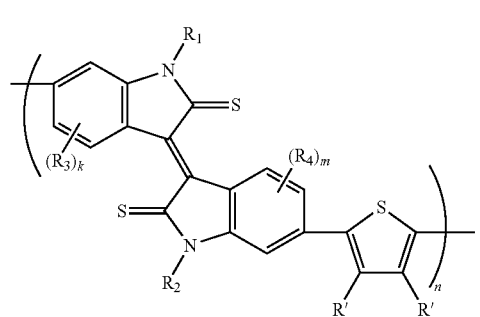
Formula (2)
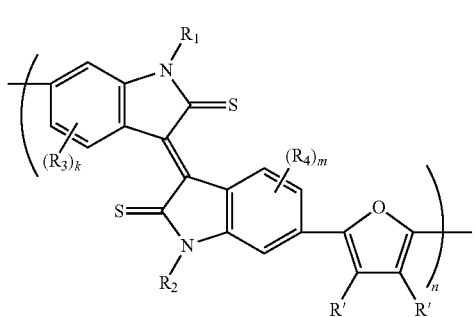
Formula (3)
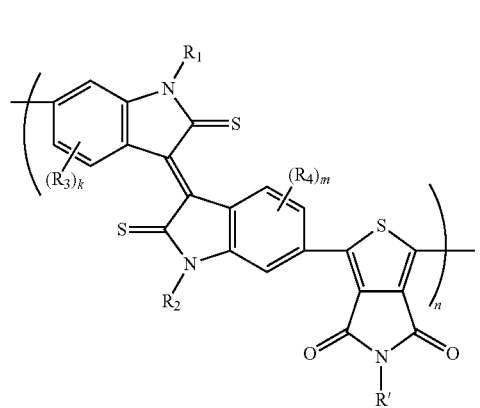
Formula (4)
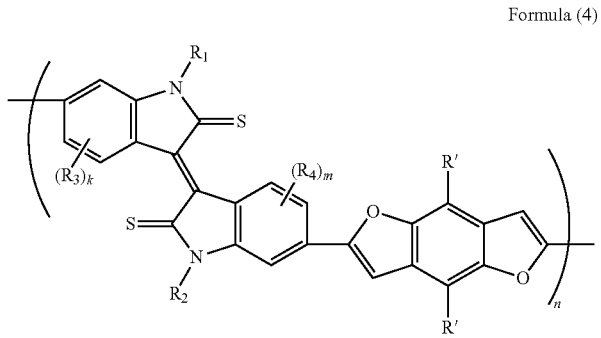
Formula (5)
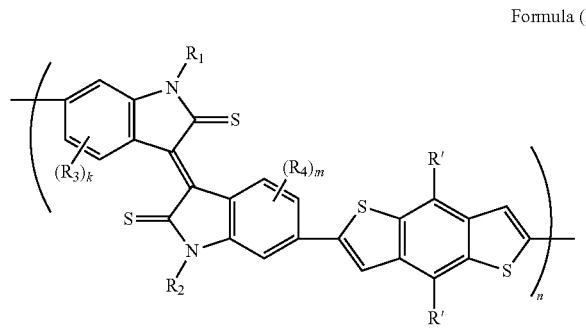
Formula (6)
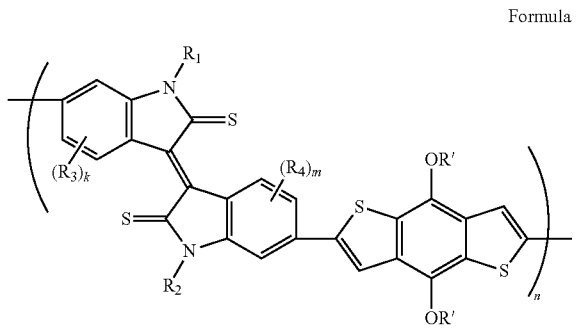

Formula (7)
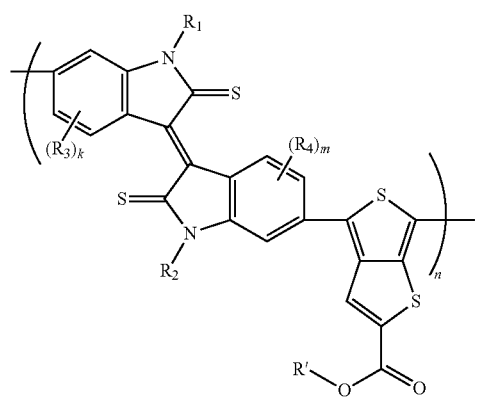
Formula (8)
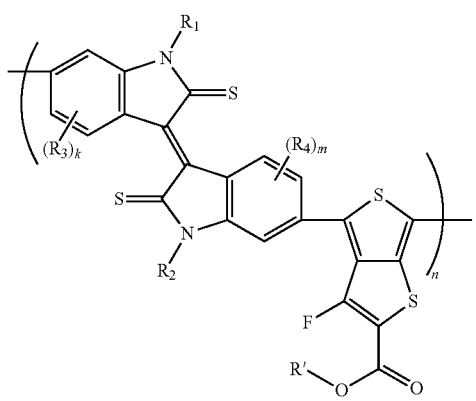
Formula (9)
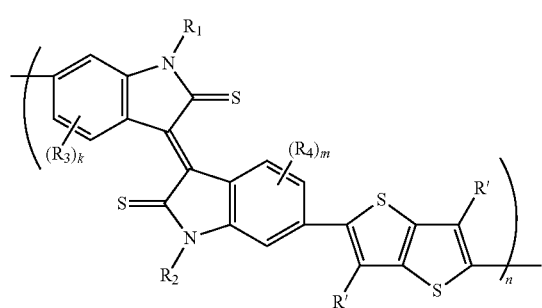
Formula (10)
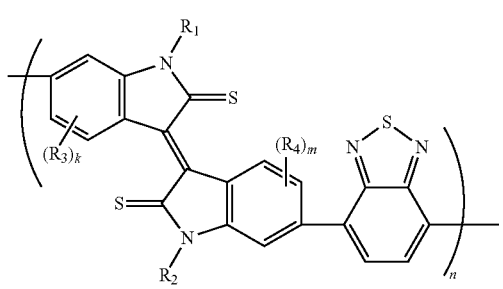
Formula (11)
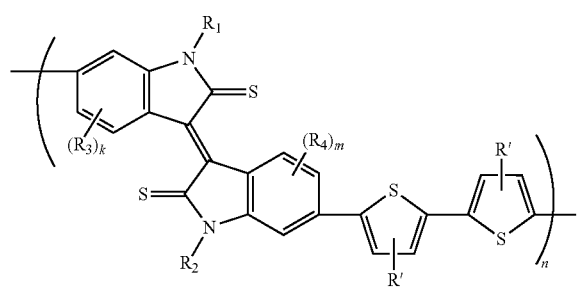
Formula (12)
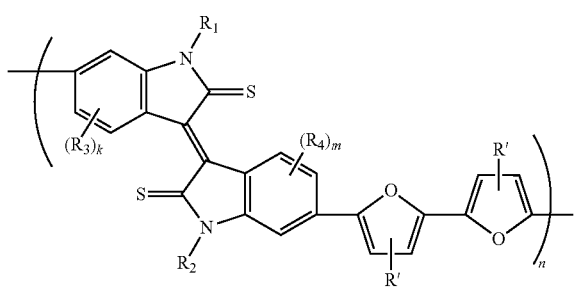
Formula (13)
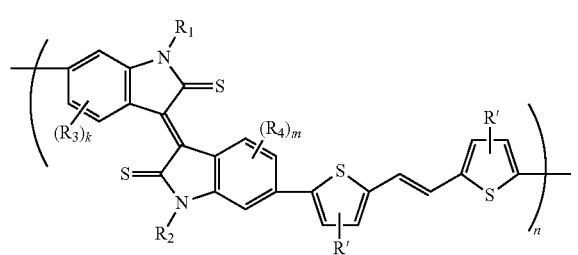
Formula (14)
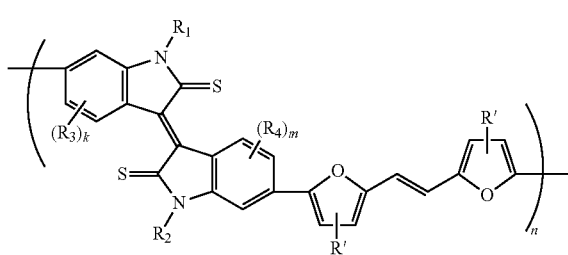
Formula (15)
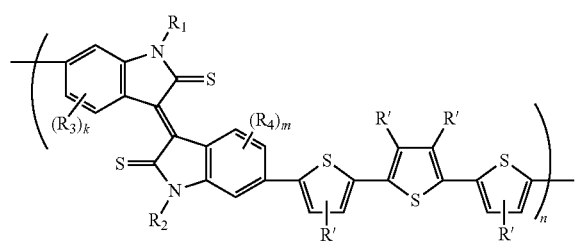
Formula (16)
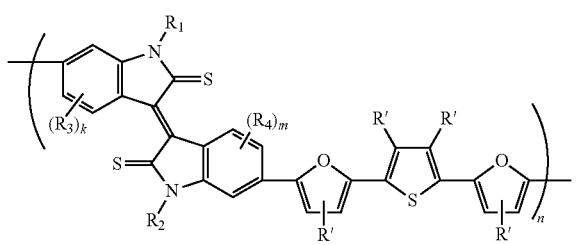

-continued
Formula (17)
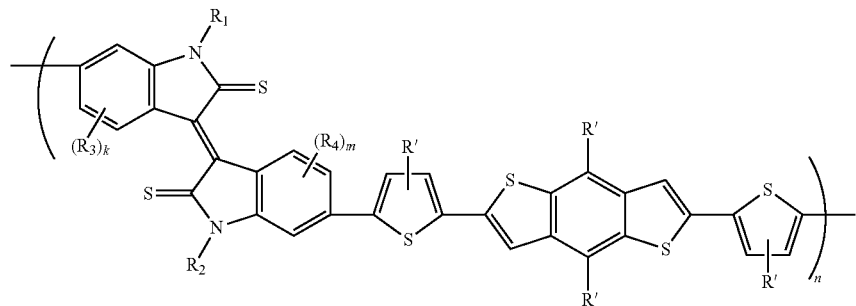
Formula (18)
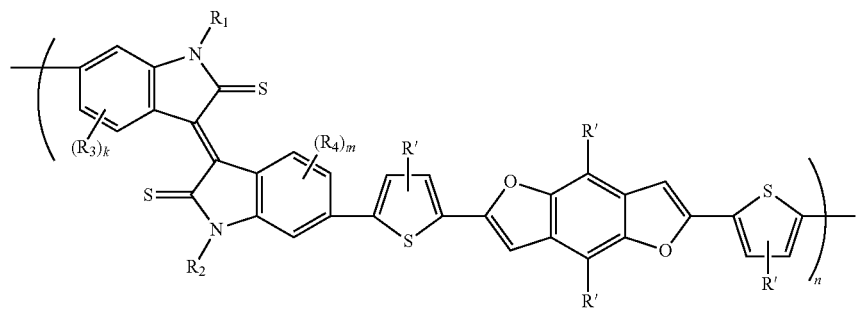
Formula (19)
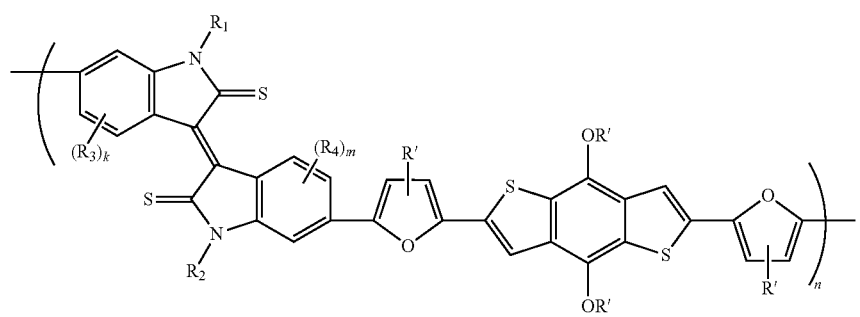
Formula (20)
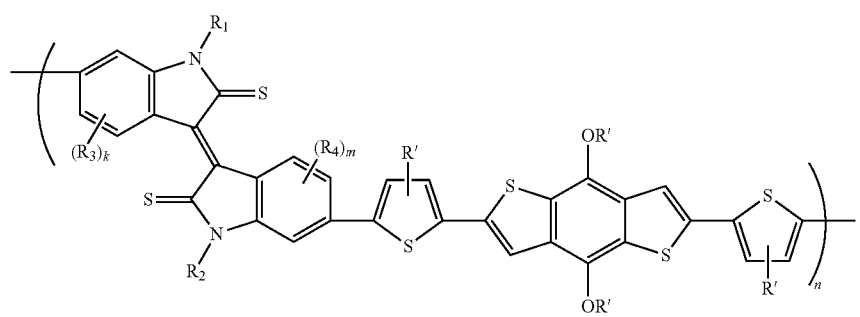
Formula (21)
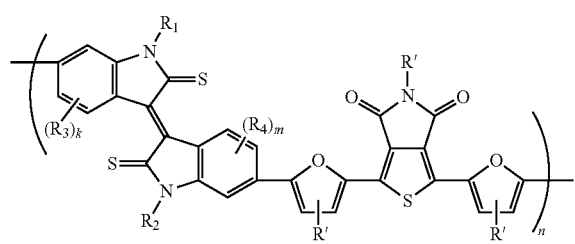
Formula (22)
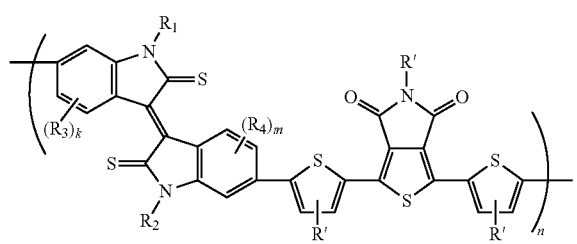

Formula (23)
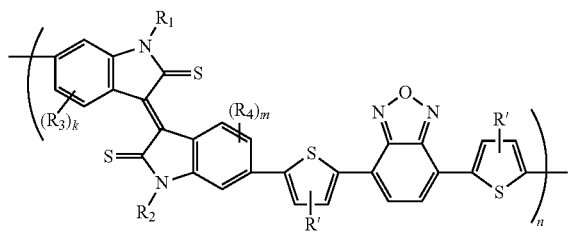
Formula (24)
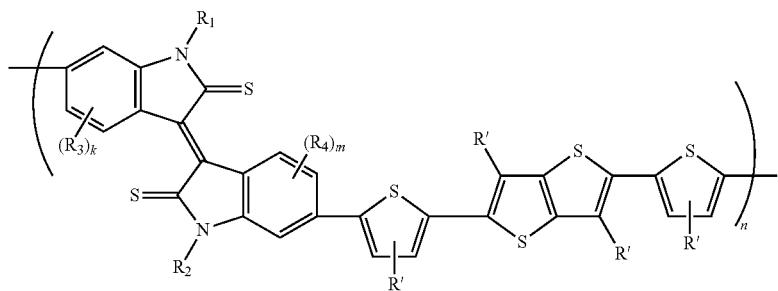
Formula (25)
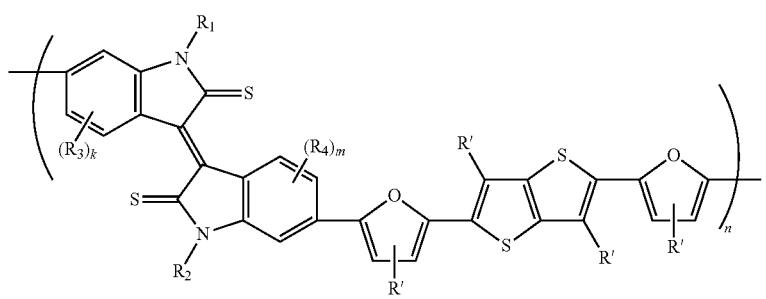
Formula (26)
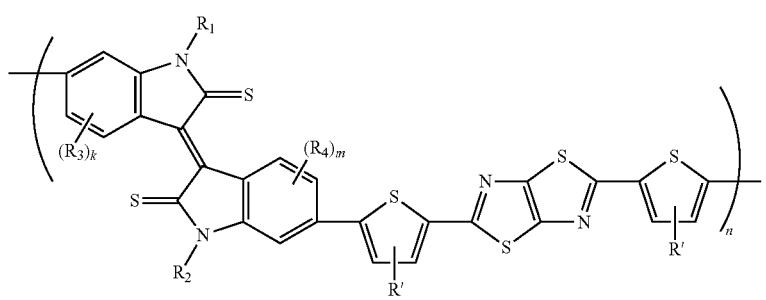
Formula (27)
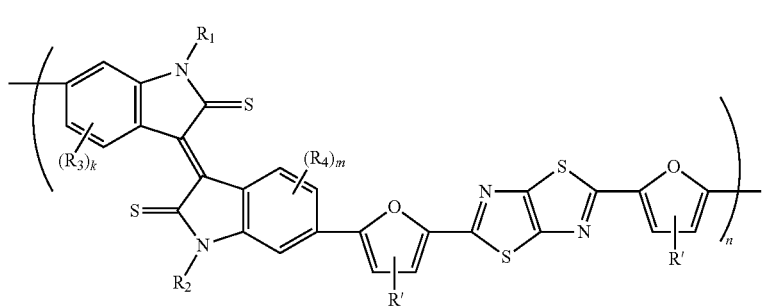

-continued
Formula (28)
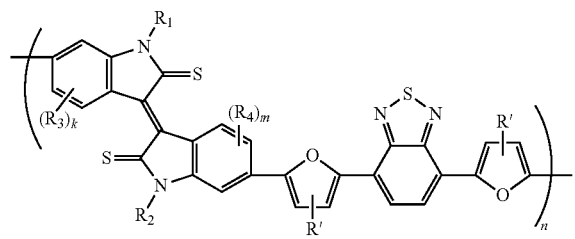
Formula (29)
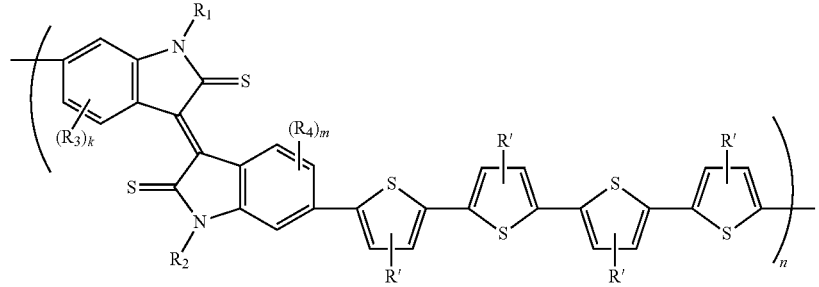
Formula (30)
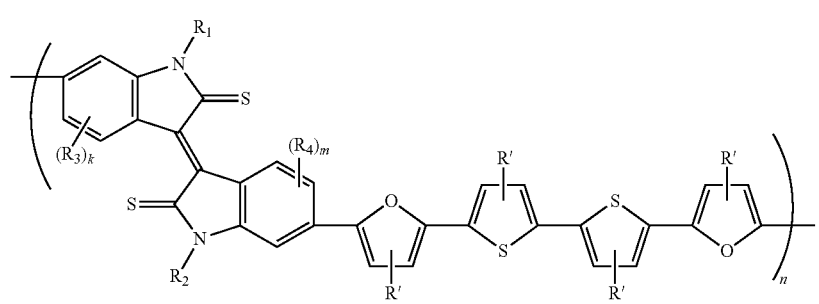
Formula (31)
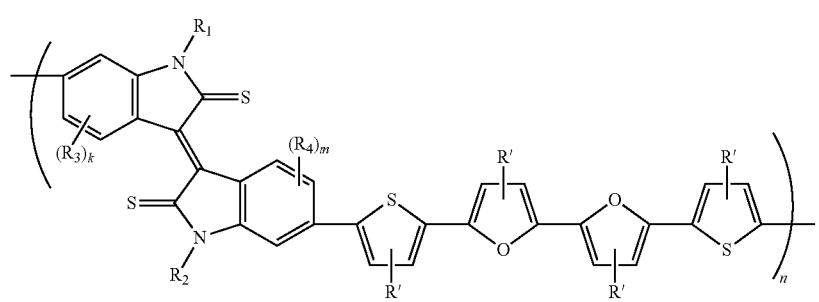
Formula (32)
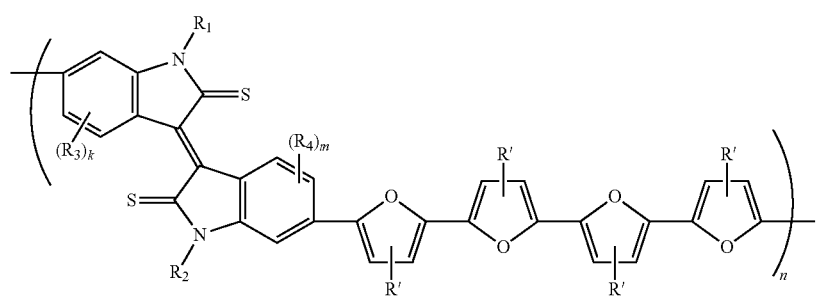
Formula (33)

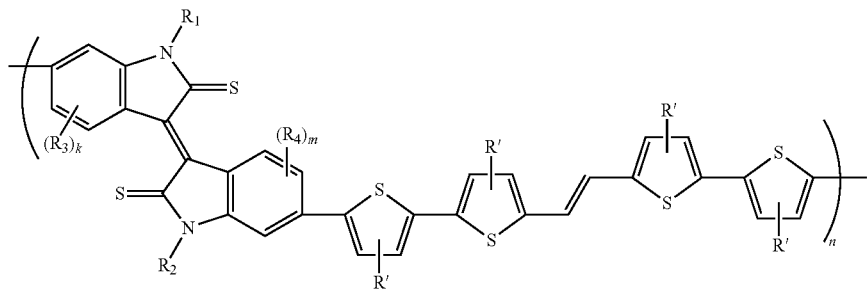
Formula (34)
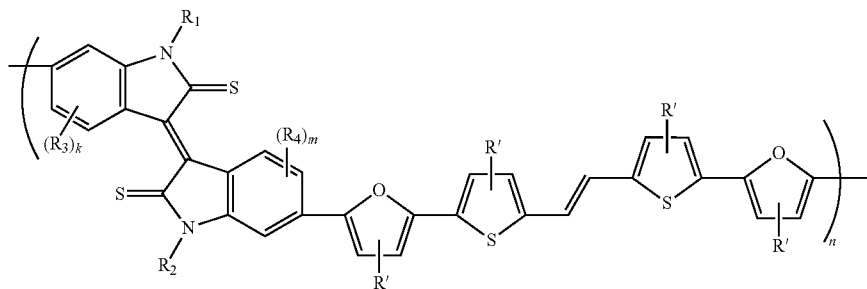
Formula (35)
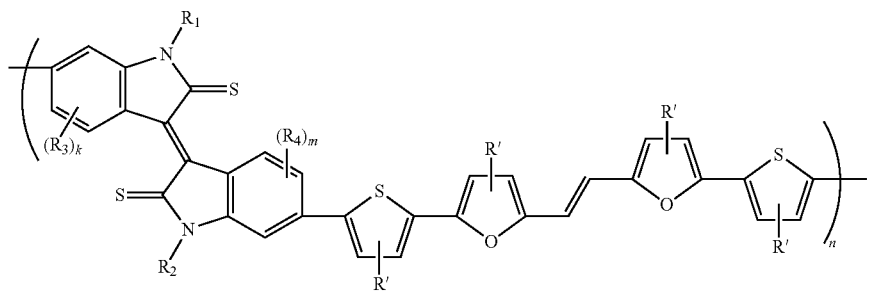
Formula (36)
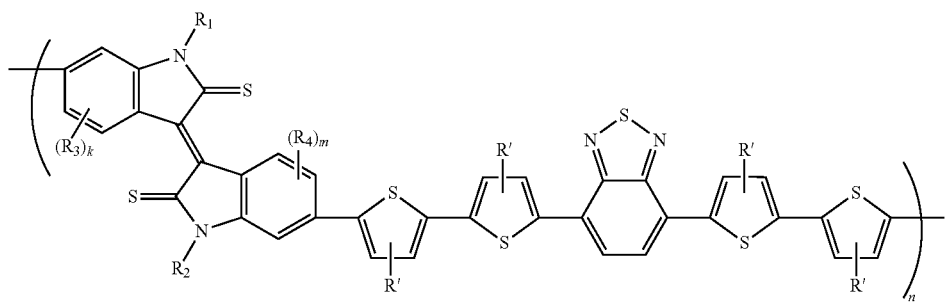
Formula (37)
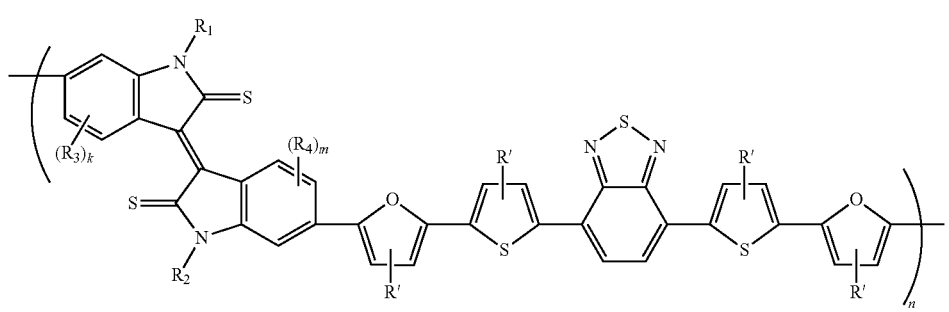
Formula (38)

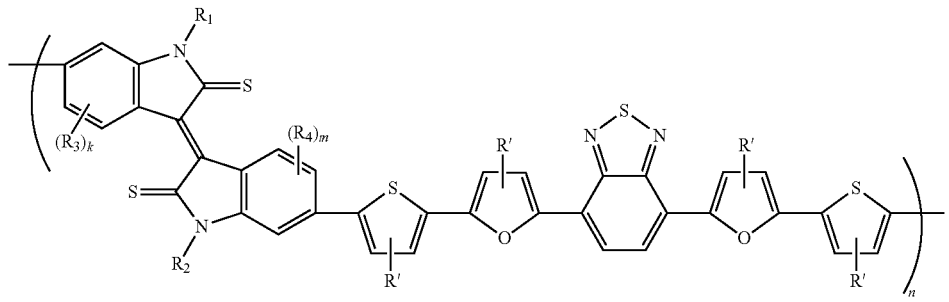

Formula (39)

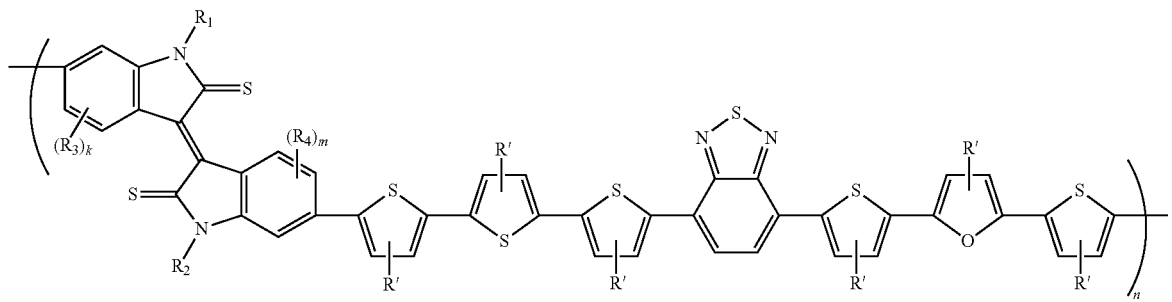

Formula (40)

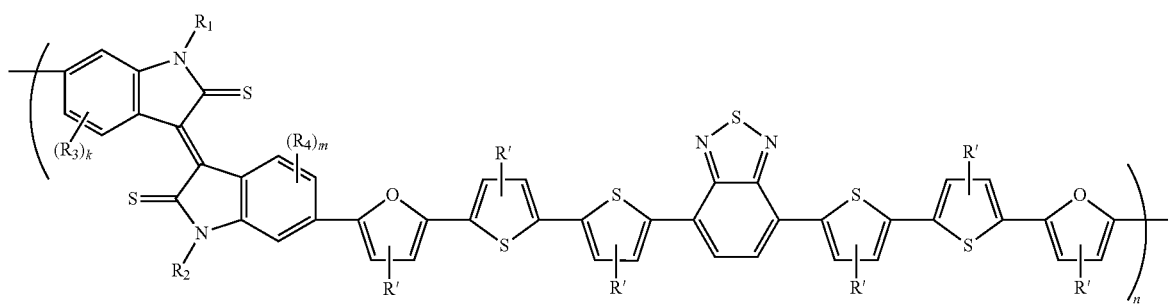

Formula (41)

wherein $R_1$ and $R_2$ are independently hydrogen, alkyl, substituted alkyl, aryl, or substituted aryl; and wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$.

5. The polymer of claim 4, wherein $R_1$ and $R_2$ are the same.

6. The polymer of claim 4, wherein $R_1$ and $R_2$ are alkyl.

7. The polymer of claim 1, wherein x is at least 1.

8. The polymer of claim 1, wherein each Ar unit is independently selected from the group consisting of:

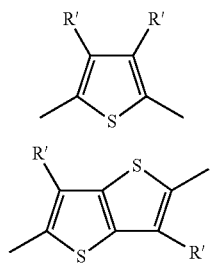

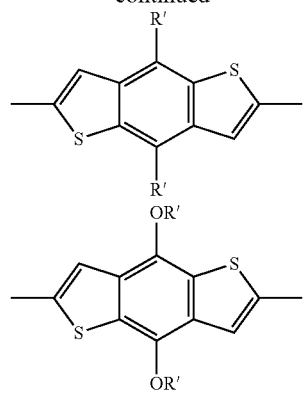

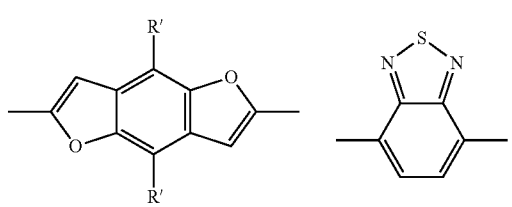

-continued

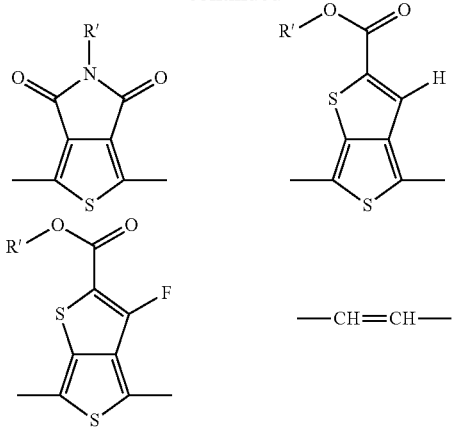

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$.

9. The polymer of claim 1, wherein x is at least 1, and wherein at least one Ar unit is a thiophene unit.

10. A semiconductor composition comprising a polymer of Formula (I):

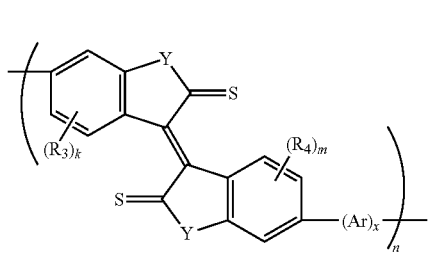

Formula (I)

wherein each Y is independently O or N—R$_5$, wherein each R$_5$ is independently hydrogen, alkyl, substituted alkyl, aryl, or substituted aryl;
each R$_3$ and R$_4$ is independently alkyl, substituted alkyl, aryl, substituted aryl, heteroaryl, substituted heteroaryl, halogen, alkoxy, alkylthio, trialkylsilyl, —CN, or —NO$_2$;
k and m are independently 0, 1, 2, or 3;
each Ar is independently ethenyl, ethynyl, aryl, substituted aryl, heteroaryl, or substituted heteroaryl;
x is from 0 to 8; and
wherein n is the number of repeating units and is from 2 to about 5,000.

11. The composition of claim 10, wherein at least one Ar unit is thieno[3,2-b]thiophene:

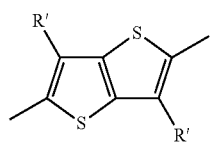

wherein each R' is independently selected from hydrogen, alkyl, substituted alkyl, aryl, substituted aryl, heteroaryl, substituted heteroaryl, halogen, alkoxy, alkylthio, trialkylsilyl, —ON, or —NO$_2$.

12. The composition of claim 10, wherein each Ar unit is independently selected from the group consisting of:

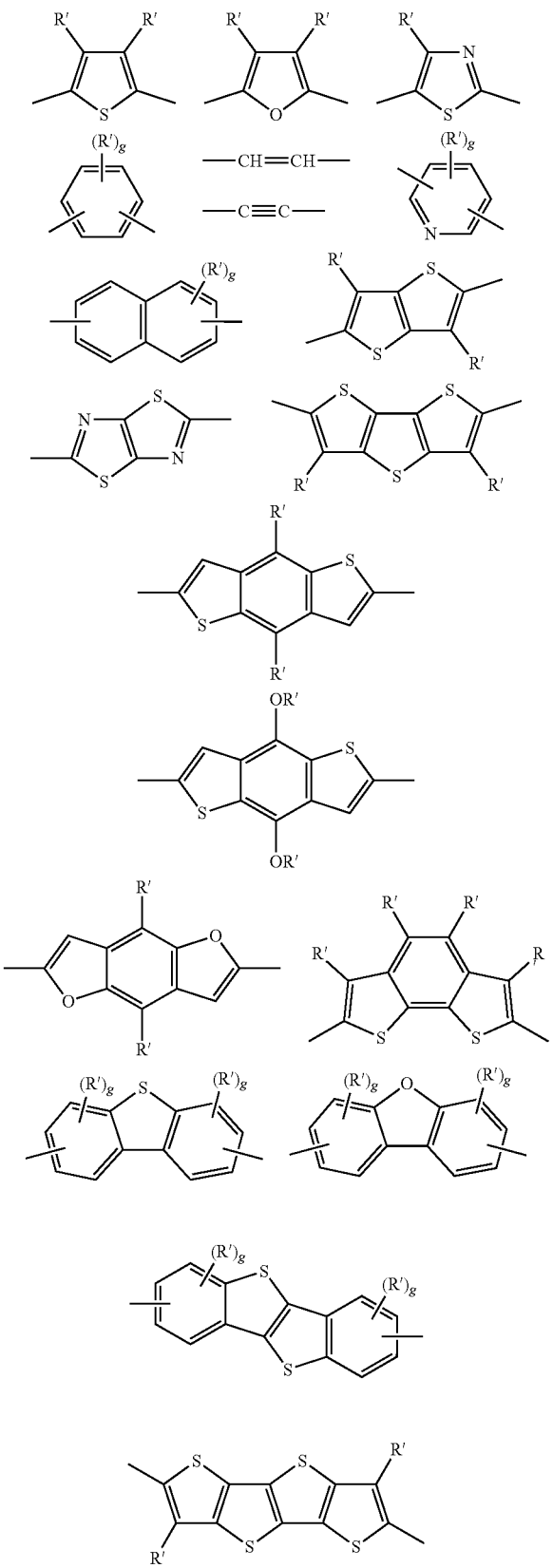

51
-continued
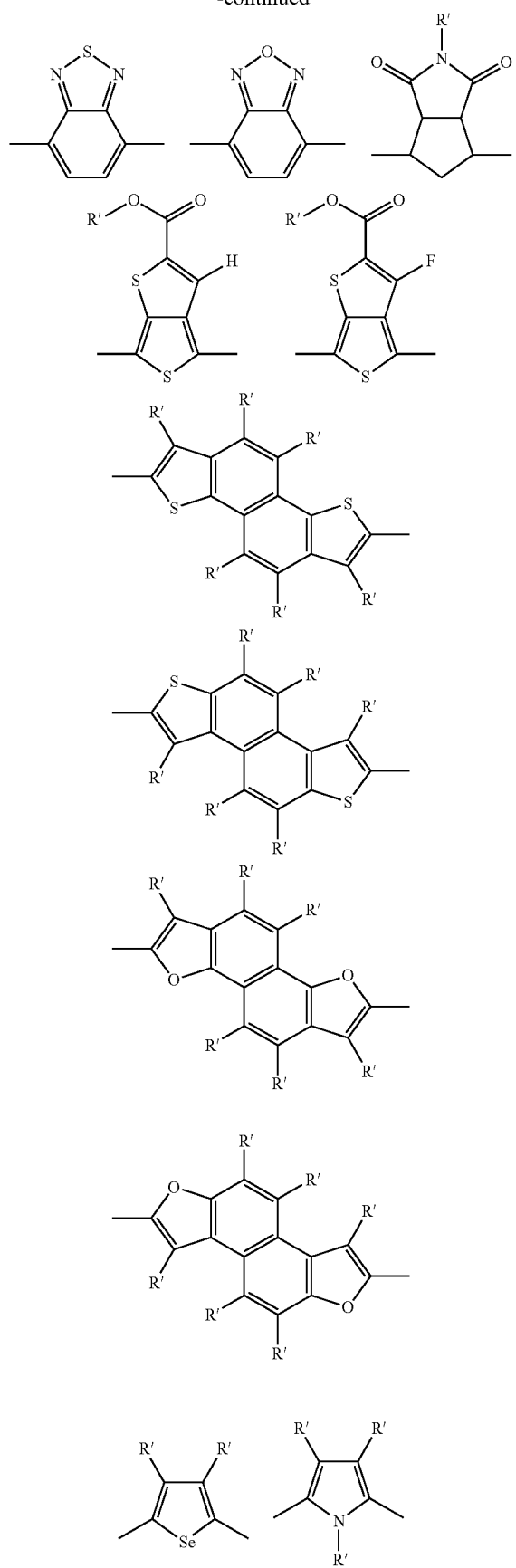
52
-continued
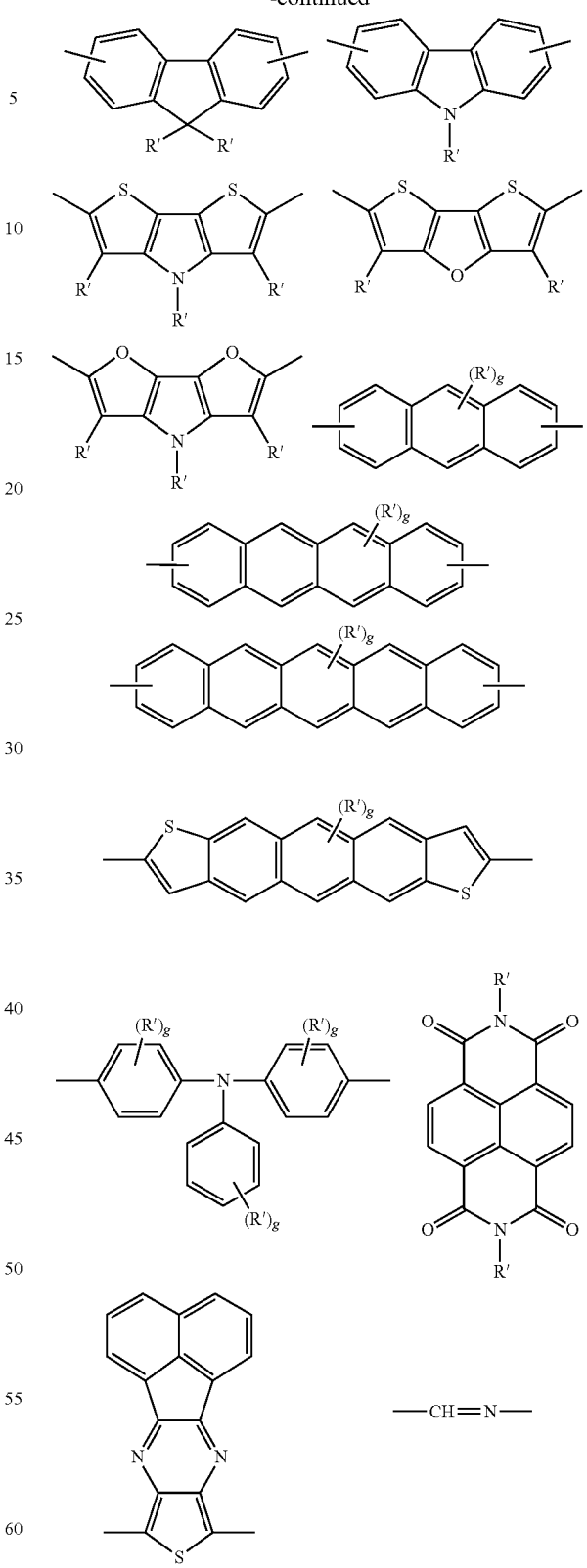
wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$; and g is from 3 to 12.

13. The composition of claim 10, wherein the polymer has the structure of one of Formulas (1)-(41):
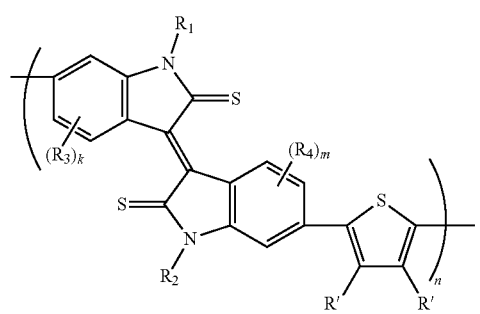
Formula (1)
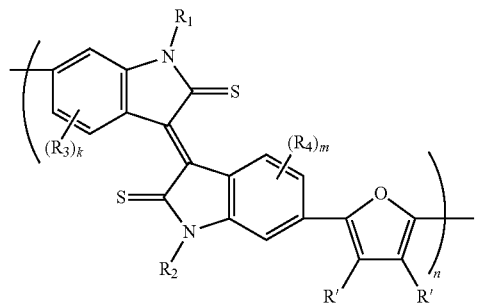
Formula (2)
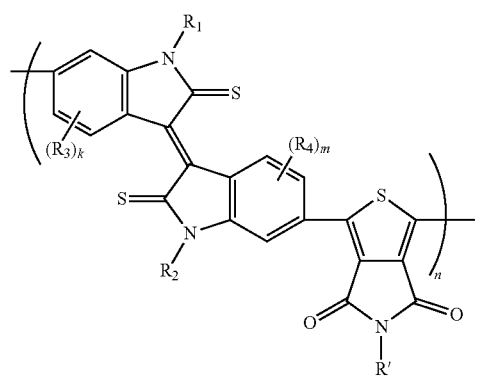
Formula (3)
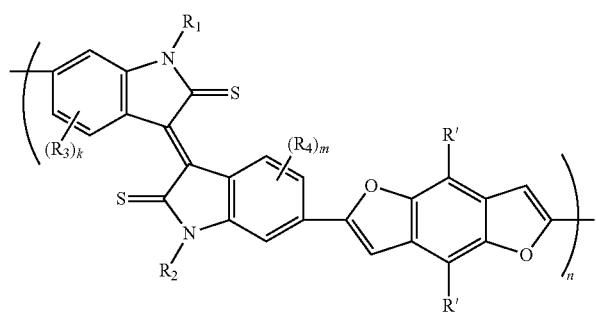
Formula (4)
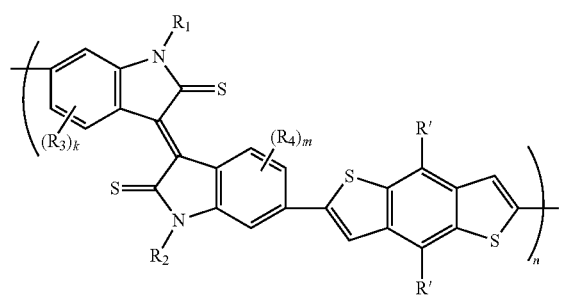
Formula (5)
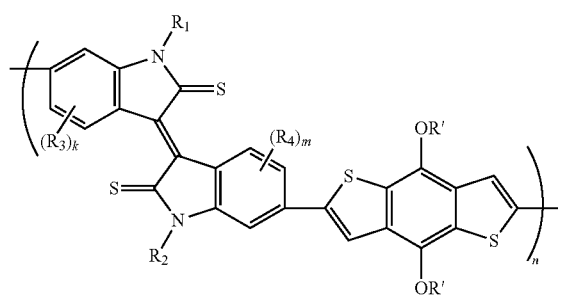
Formula (6)
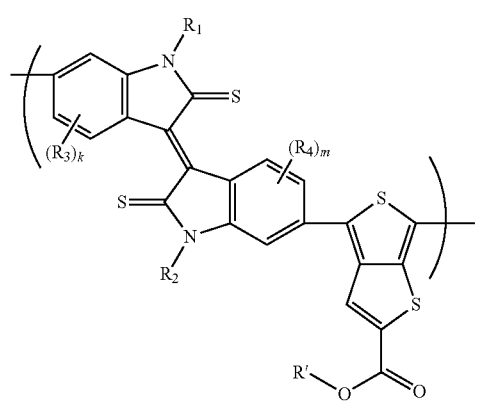
Formula (7)
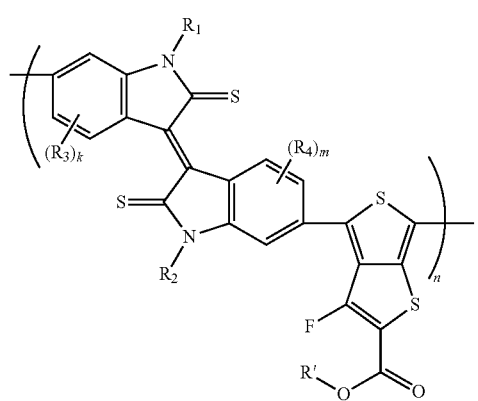
Formula (8)

-continued
Formula (9)
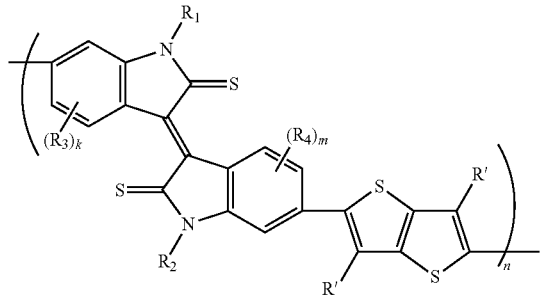
Formula (10)
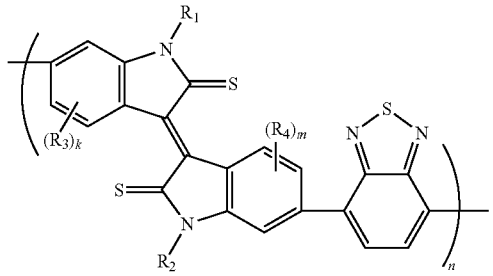
Formula (11)
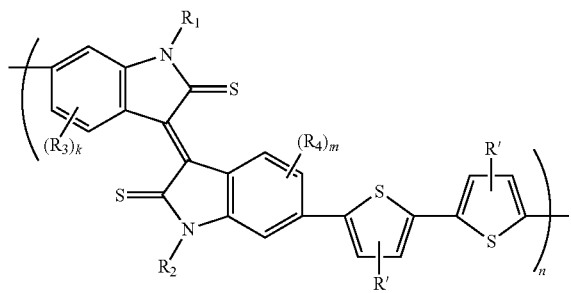
Formula (12)
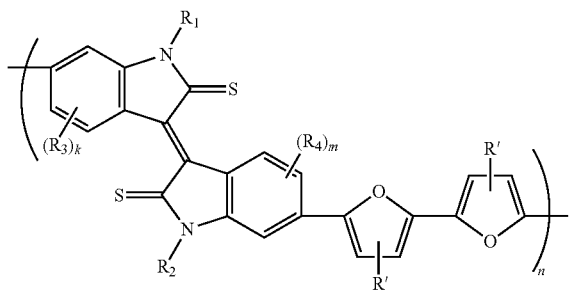
Formula (13)
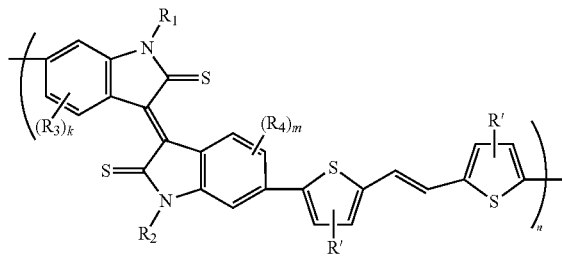
Formula (14)
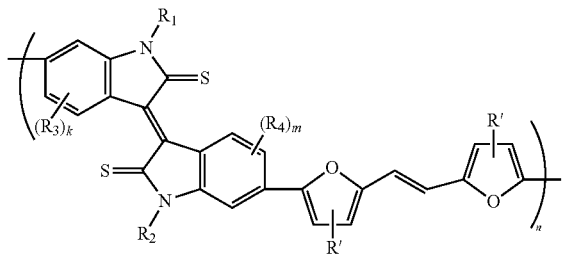
Formula (15)
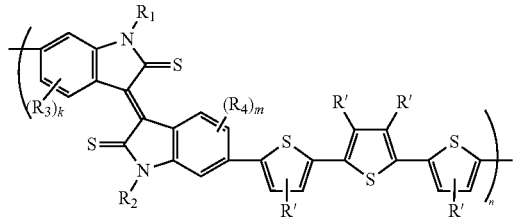
Formula (16)
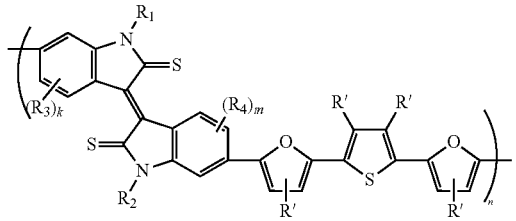
Formula (17)
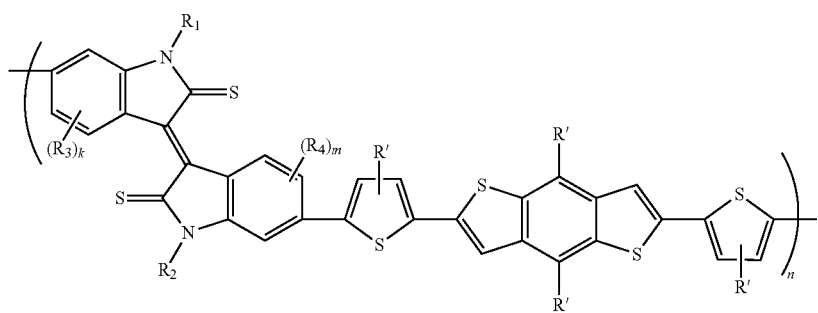

Formula (18)
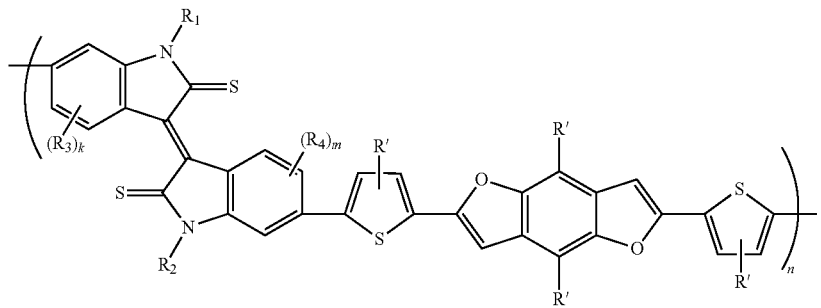
Formula (19)
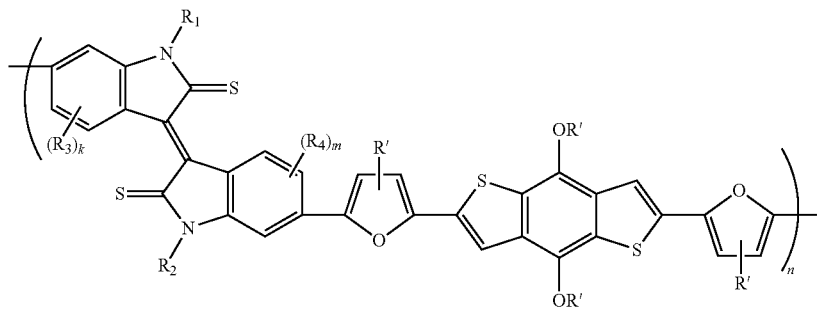
Formula (20)
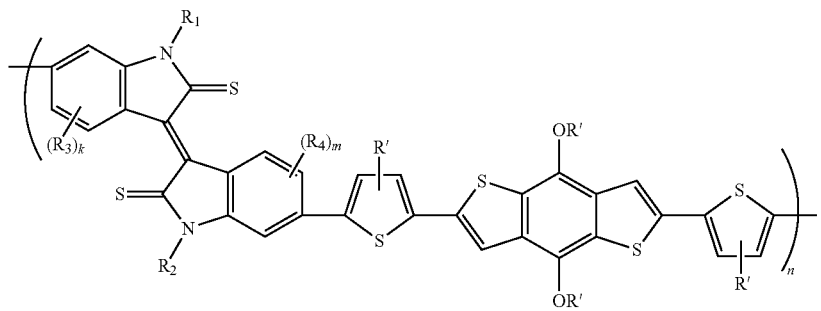
Formula (21)
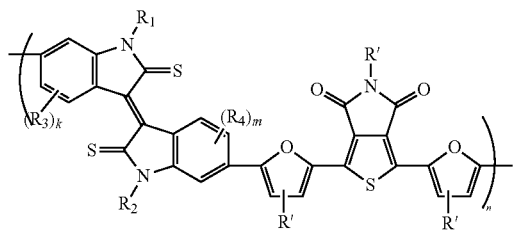
Formula (22)
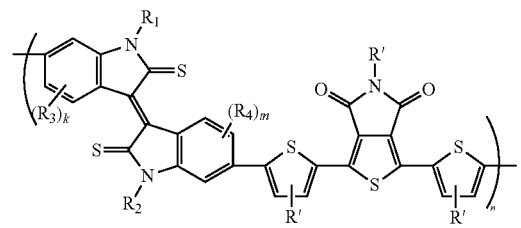
Formula (23)
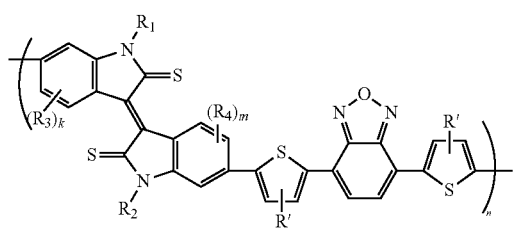
Formula (24)
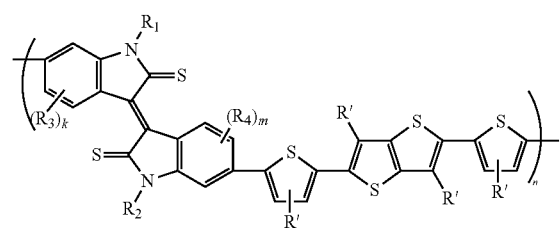

Formula (25)
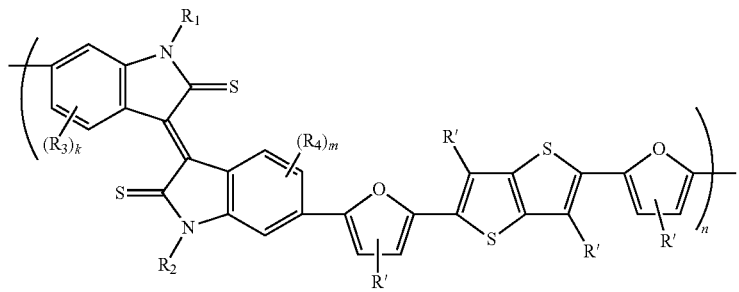
Formula (26)
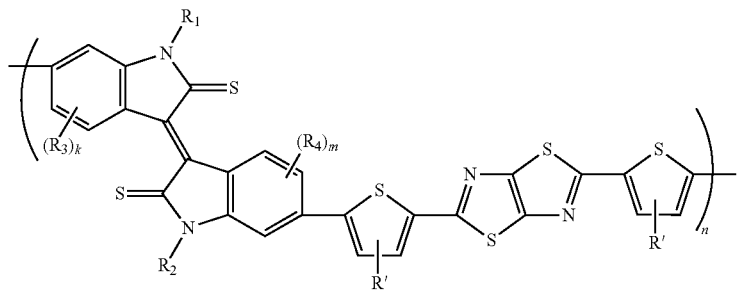
Formula (27)
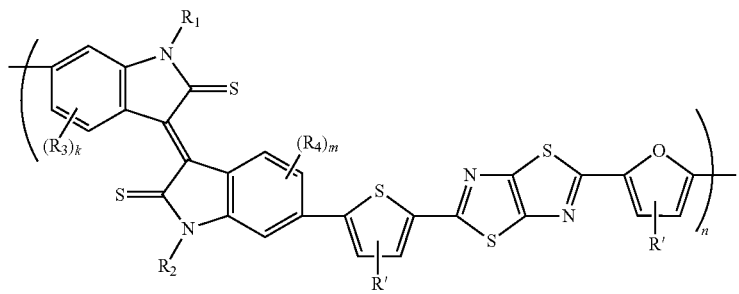
Formula (28)
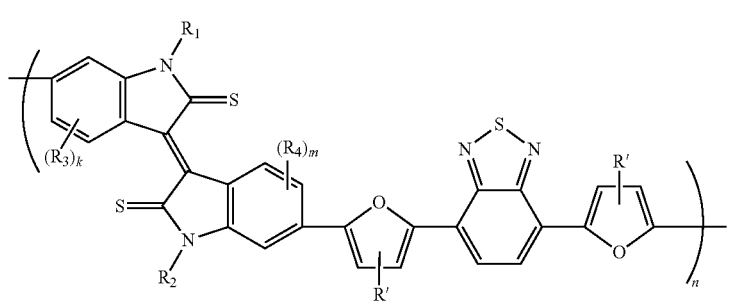
Formula (29)
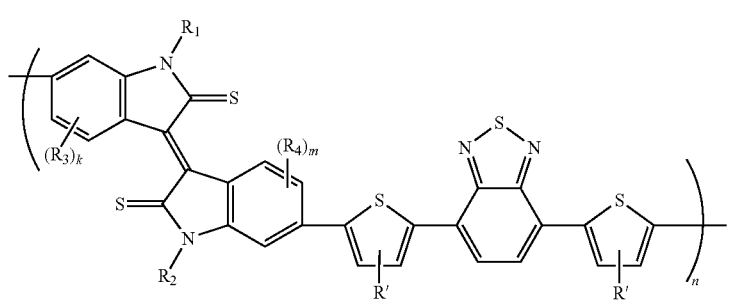

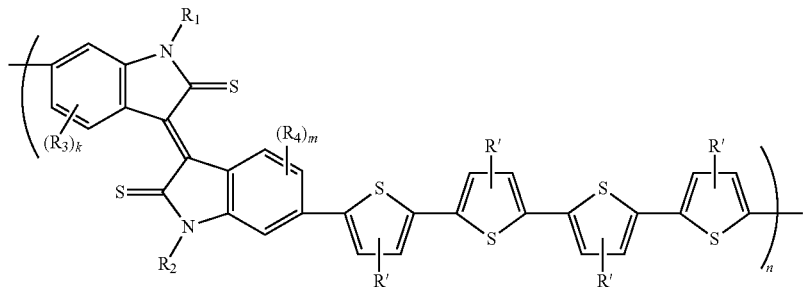
Formula (30)
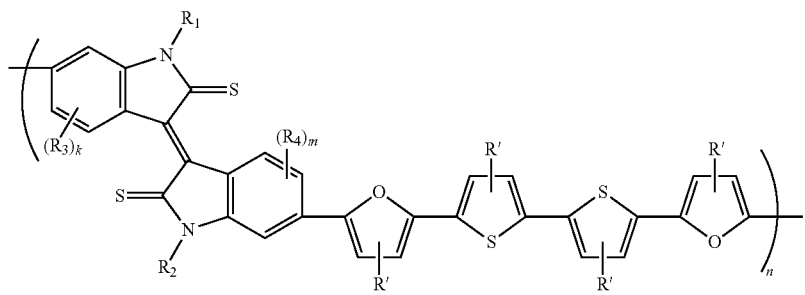
Formula (31)
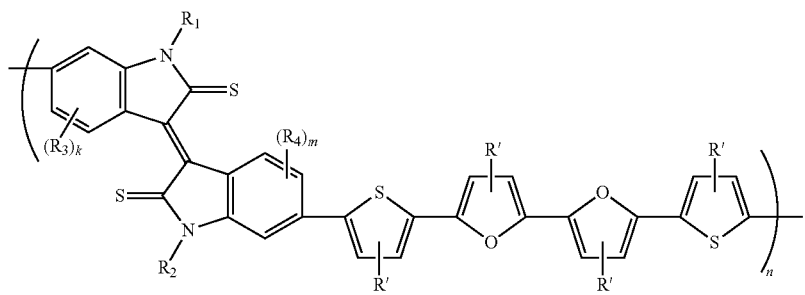
Formula (32)
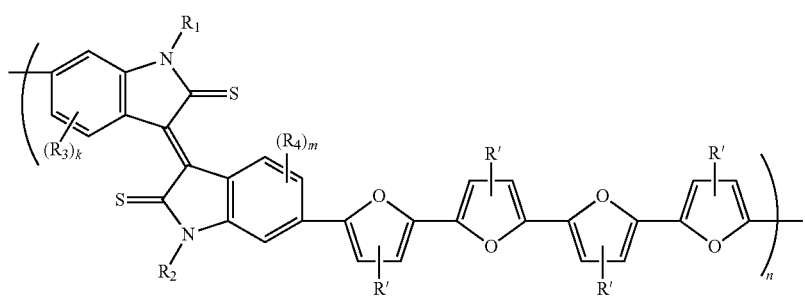
Formula (33)
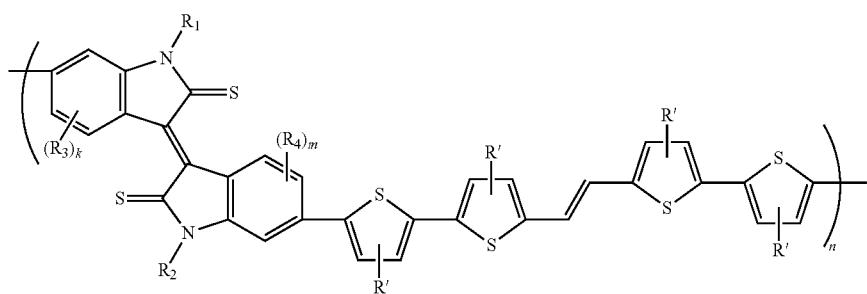
Formula (34)

-continued
Formula (35)
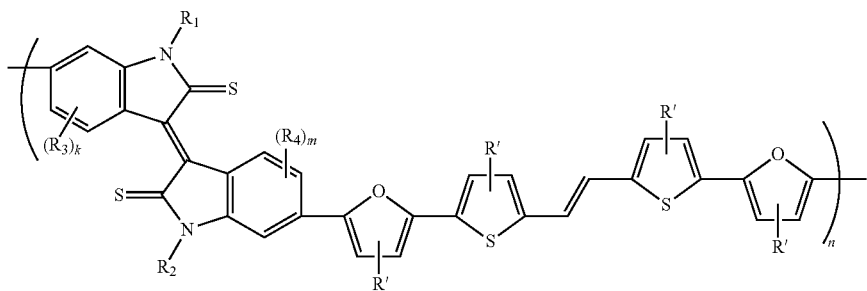
Formula (36)
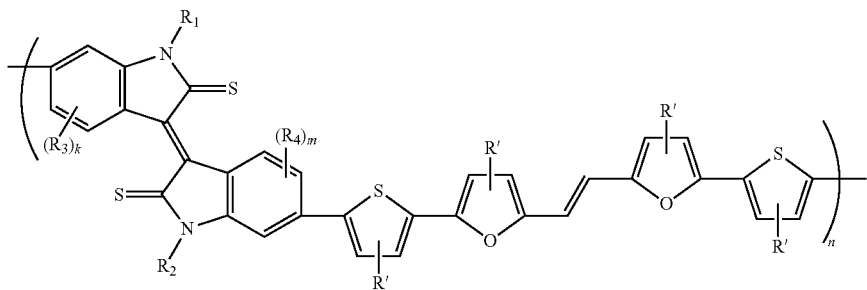
Formula (37)
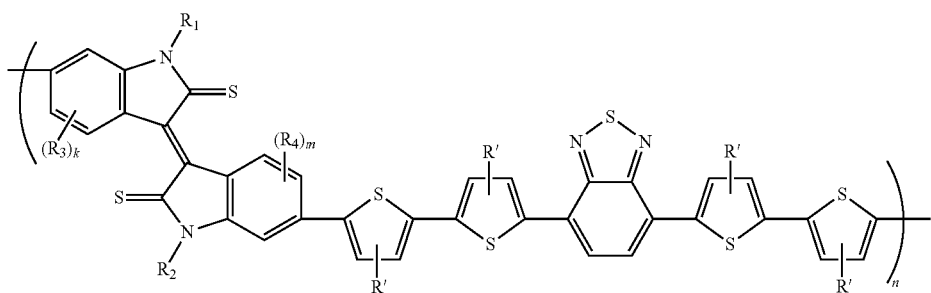
Formula (38)
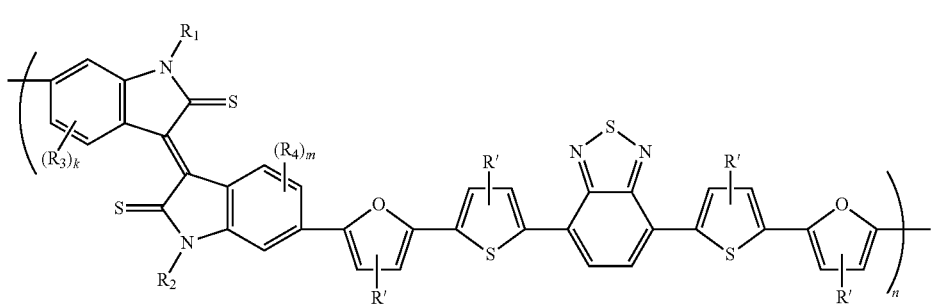
Formula (39)
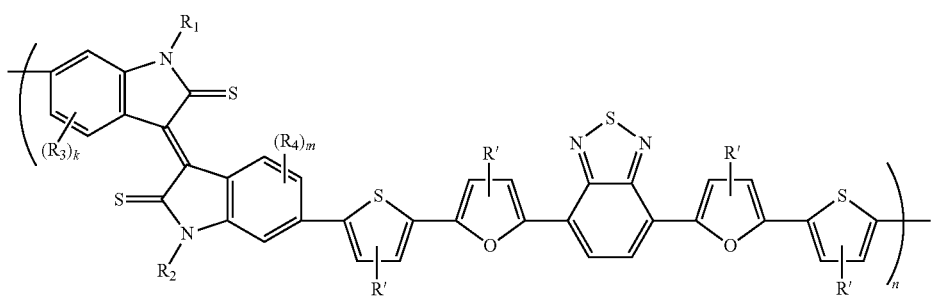

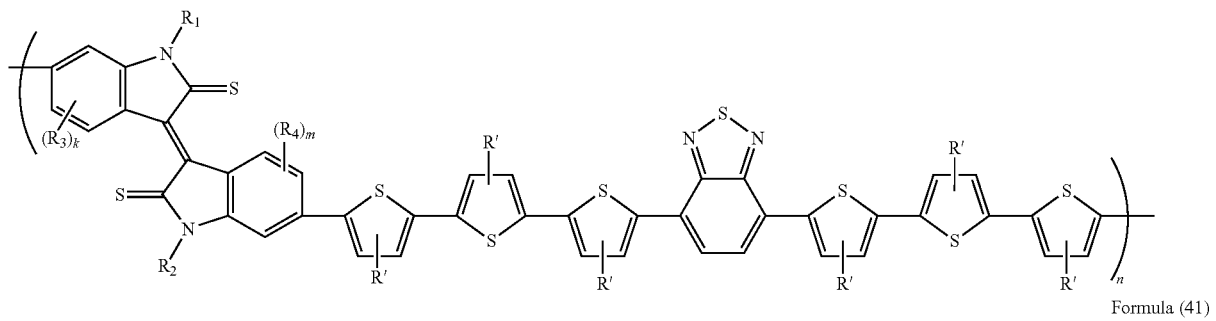

Formula (40)

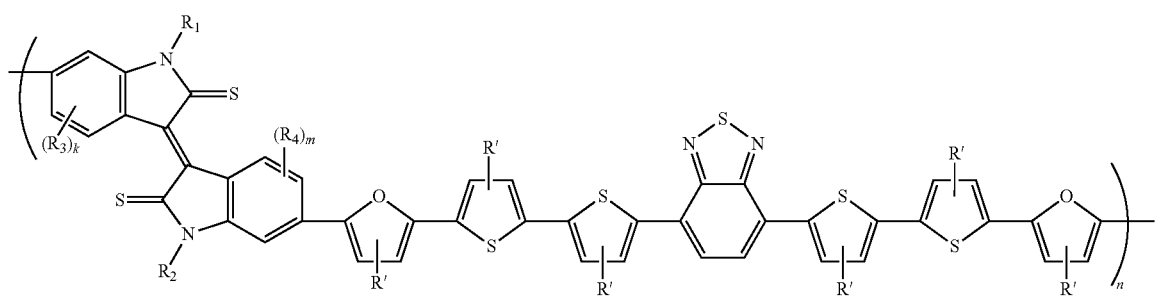

Formula (41)

wherein $R_1$ and $R_2$ are independently hydrogen, alkyl, substituted alkyl, aryl, or substituted aryl; and wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$.

14. The composition of claim 13, wherein $R_1$ and $R_2$ are the same.

15. The composition of claim 13, wherein $R_1$ and $R_2$ are alkyl.

16. The composition of claim 10, wherein x is at least 1.

17. The composition of claim 10, wherein each Ar unit is independently selected from the group consisting of:

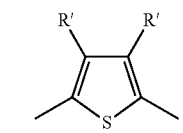 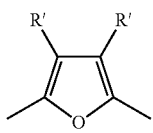

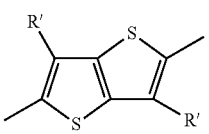 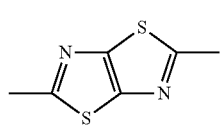

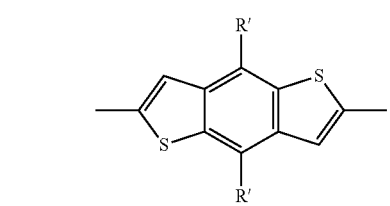

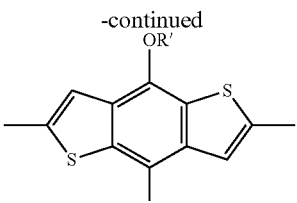

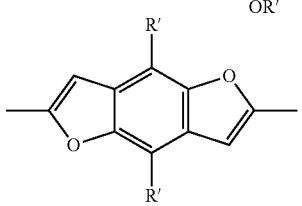 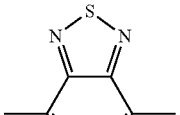

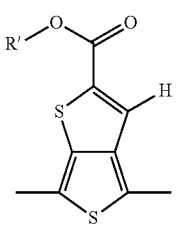

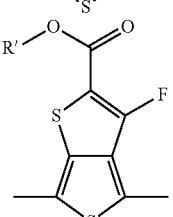 

—CH=CH— wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$.

18. The composition of claim 10, wherein x is at least 1, and wherein at least one Ar unit is a thiophene unit.

19. The composition of claim 10, further comprising a solvent.

20. An electronic device comprising a semiconducting layer, the semiconducting layer comprising a polymer of Formula (I):

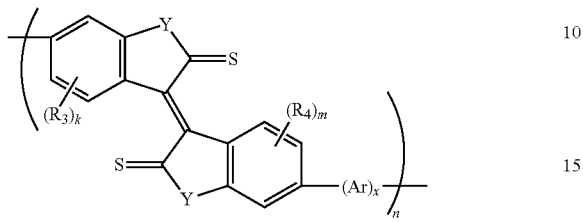

Formula (I)

wherein each Y is independently O or N—$R_5$, wherein each $R_5$ is independently hydrogen, alkyl, substituted alkyl, aryl, or substituted aryl;

each $R_3$ and $R_4$ is independently alkyl, substituted alkyl, aryl, substituted aryl, heteroaryl, substituted heteroaryl, halogen, alkoxy, alkylthio, trialkylsilyl, —CN, or —$NO_2$;

k and m are independently 0, 1, 2, or 3;

each Ar is independently ethenyl, ethynyl, aryl, substituted aryl, heteroaryl, or substituted heteroaryl;

x is from 0 to 8; and wherein n is the number of repeating units and is from 2 to about 5,000.

* * * * *